United States Patent
Gorrachategui et al.

(10) Patent No.: US 11,346,891 B2
(45) Date of Patent: May 31, 2022

(54) BATTERY DIAGNOSTIC SYSTEM FOR ESTIMATING REMAINING USEFUL LIFE (RUL) OF A BATTERY

(71) Applicant: Mitsubishi Electric Research Laboratories, Inc., Cambridge, MA (US)

(72) Inventors: Ivan Sanz Gorrachategui, Cambridge, MA (US); Milutin Pajovic, Cambridge, MA (US); Ye Wang, Andover, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 161 days.

(21) Appl. No.: 16/824,752

(22) Filed: Mar. 20, 2020

(65) Prior Publication Data
US 2021/0293890 A1    Sep. 23, 2021

(51) Int. Cl.
| | |
|---|---|
| *G01R 1/073* | (2006.01) |
| *G01R 31/392* | (2019.01) |
| *G01R 31/388* | (2019.01) |
| *G01R 31/36* | (2020.01) |
| *G01R 31/367* | (2019.01) |

(52) U.S. Cl.
CPC ......... *G01R 31/392* (2019.01); *G01R 31/367* (2019.01); *G01R 31/3648* (2013.01); *G01R 31/388* (2019.01)

(58) Field of Classification Search
CPC .................................................. G01R 31/392
USPC ............................................ 702/63; 320/132
See application file for complete search history.

(56) References Cited

U.S. PATENT DOCUMENTS

| | | | | |
|---|---|---|---|---|
| 8,332,342 | B1* | 12/2012 | Saha | G01R 31/392 706/45 |
| 8,855,954 | B1* | 10/2014 | Bickford | G01R 31/392 702/63 |
| 2017/0205466 | A1* | 7/2017 | He | G06F 17/16 |
| 2018/0143257 | A1* | 5/2018 | Garcia | G01R 31/382 |
| 2019/0165432 | A1* | 5/2019 | Park | G01R 31/367 |
| 2019/0176639 | A1* | 6/2019 | Kumar | B60L 3/0046 |

* cited by examiner

*Primary Examiner* — Ricky Go
(74) *Attorney, Agent, or Firm* — Gennadiy Vinokur; Hironori Tsukamoto

(57) ABSTRACT

A battery diagnostic system is disclosed for an RUL estimation of a battery. The battery diagnostic system comprises a memory configured to store a neural network trained to estimate a remaining useful life (RUL) of a test battery from a predetermined set of features indicative of a battery cycle of the test battery and a capacity of the test battery; a charging system configured to charge and discharge the test battery to provide measurements of the battery cycle and the capacity of the test battery; a processor configured to extract the predetermined set of features from the measurements to submit the extracted set of features to the neural network and an output interface configured to output the estimated RUL of the test battery.

11 Claims, 20 Drawing Sheets

| Algorithm | RMSE (cycles) | MRE (%) | MRE (%) (>150 cycles) |
|---|---|---|---|
| Global MLR | 90 | 53.81 | 18.51 |
| Global MLP | 52 | 23.03 | 10.51 |
| MLP Short RUL expert (<150 cycles) | 13 | 28.73 | - |
| MLP Long RUL expert (>150 cycles) | 61 | 10.32 | 10.32 |
| MLP based Multiple Expert | 49 | 15.2 | 9.79 |

FIG. 11

BATTERY DIAGNOSTIC SYSTEM FOR ESTIMATING REMAINING USEFUL LIFE (RUL) OF A BATTERY

TECHNICAL FIELD

This invention generally relates to a battery diagnostic system, and more specifically to a battery diagnostic system for estimating the remaining useful life (RUL) of a battery.

BACKGROUND

Nowadays, rechargeable batteries are widely used in electric vehicles, portable terminals, devices, and the like. The rechargeable batteries provide ease-of-use benefits as they can be charged and/or discharged repeatedly. However, these rechargeable batteries undergo ageing with time and/or usage, and become obsolete for use in applications corresponding to the electric vehicles and other devices. Typically, these rechargeable batteries are recycled for reuse in different applications, such as second-life applications of batteries. The second-life applications may include energy storage systems (ESS) for home, commercial or industrial, or grid-scale energy storage systems. ESS based rechargeable battery technologies are gradually increasing due to expansion of electric vehicles. This results in generating an enormous second-life battery market. Such emergence of the second-life battery market is promoting reuse of the rechargeable batteries.

Further, it may be crucial to determine whether a battery is suitable for reuse in the second-life applications. The reusability of the battery may be determined based on a number of remaining cycles until end-of-life of the battery. The number of remaining cycles until end-of-life of the battery corresponds to remaining useful life (RUL) of the battery. The RUL may be estimated by relying on complete knowledge of previous battery life, such as usage and performance of the battery in the previous battery life. Such complete knowledge may be obtained when the batteries are deployed in online and embedded applications. However, it may not be feasible and practical to rely on the previous usage and performance of the battery for the RUL estimation. Furthermore, the RUL may be estimated based on estimation model for batteries. The estimation model may be trained based on measurements of test cycles of different types of the batteries. However, training based on the measurements of the test cycles of the different batteries may fail to provide an accurate estimated RUL result. In some cases, a large number of test cycles may be performed to the battery to obtain measurements for the RUL estimation. However, life of the battery may be wasted in such testing purpose.

Accordingly, there is a need for a battery diagnostic system that can estimate RUL of a used battery for repurposing the used battery in second-life applications, while precluding requirement of previous usage and performance information of the battery.

SUMMARY

Some embodiments are based on recognition that RUL of a battery can be estimated without need of information regarding previous usage and performance of the battery, in an accurate and feasible manner for repurposing the battery in second life market or applications, such as energy storage systems for home, commercial or the like.

To that end, it is an object of some embodiments to provide a battery diagnostic system and a method for estimating the RUL of the battery. Additionally, or alternatively, it is another object of some embodiments to provide the RUL estimation from a limited number of test charge and discharge cycles of the battery, without relying on prior usage and performance of the battery. Additionally, or alternatively, it is another object of some embodiments to provide a data-driven method for estimating the RUL of different types of batteries, e.g., Lithium-ion batteries, Lithium Iron Phosphate (LFP) batteries, or the like.

It is an object of some embodiments to train the data-driven method using a training dataset of capacity, voltage and current measurements taken under same conditions of a certain number of batteries of the same type, e.g., sharing the same chemistry, manufacturer and model. It is an object of some embodiments to train the data-driven method using measurements taken over a period of time, e.g., over several years, of the batteries that undergo different usage patterns. More specifically, it is an object of some embodiments to estimate the RUL, without a need to design different estimation model for the different types of batteries.

Some embodiments are based on a realization that a data-driven based RUL estimation of the battery may be provided, without increasing number of charge/discharge cycles (i.e., test cycles) for the battery. To that end, it is an object of some embodiments to provide a trained neural network to estimate the RUL from a predetermined set of features indicative of a battery cycle of the battery and a capacity of the battery. Additionally, or alternatively, it is another object of some embodiments to provide a minimum number of features for the data-driven RUL estimation for different types of batteries. Some embodiments are based on recognition to increase the accuracy of RUL estimation without increasing a number of extracted features and/or a number of observed test cycles. To that end, an optimal number of test cycles, is determined based on the performance of a logistic regression algorithm. The optimal number of test cycles prevents wastage of battery life for testing purposes. The extracted (i.e., selected) features are indicative of different stages of battery life. Specifically, some embodiments extract and use features that evolved differently as the battery approaches an end-of-life. Each of the evolved features provides information regarding different stages or moments of remaining useful life of the battery. The differences in evolution of each of the features are combined. The combination of the differences of the feature evolution represents different stages of a battery life of the test battery.

To that end, the extracted features are selected from waveforms of the batteries generated in test cycles. In some embodiments, theses selected features are used as health indication (HI) to estimate the RUL. The features include a capacity, an internal resistance, a time interval of equal discharging voltage difference(s) (TIEDVD), a capacity fade, a capacitance peak and a voltage at capacitance peak. The features, i.e., the capacity, the internal resistance, the TIEDVD, the capacity fade, the capacitance peak and the voltage at capacitance peak are derived based on corresponding waveforms of each test cycle of the battery. To that end, some embodiments conduct test cycles to the battery to obtain the capacity, the internal resistance, the TIEDVD, the capacitance peak, the voltage at capacitance peak features and the capacity fade.

Further, the selected features are processed based on machine learning algorithms. Some embodiments are based on realization that shallow machine learning algorithms are used for processing the features, as number of features (i.e., the selected features) is limited. To that end, it is an object of some embodiments to use a multiple expert system for an accurate estimation of the RUL. The multiple expert system is formed by two processing stages: 1) classifying the battery into a short RUL battery class or a long RUL battery class and 2) estimating the RUL of the battery based on the classification. In some embodiments, the battery is classified into one of the classes based on a pre-determined classification threshold value. The classification threshold value is determined based on a logistic regression classification method.

In effect, this approach allows estimation of the RUL of the battery in an accurate manner without complete knowledge on previous usage and performance of the battery in previous life. Thus, an estimated RUL with high accuracy is obtained for the battery in an unknown moment of battery life of the battery. Moreover, the battery undergoes test cycles based on an optimal number of test cycles, without wasting useful life of the batter in testing purpose. A tested battery is classified into a short RUL or a long RUL using a logistic regression classification. Due to such classification, the experimental validation reveals that some embodiments can predict RUL of a battery with relative prediction error below 10%.

Accordingly, one embodiment discloses a battery diagnostic system that includes a memory configured to store a neural network trained to estimate a remaining useful life (RUL) of a test battery from a predetermined set of features indicative of a battery cycle of the test battery and a capacity of the test battery; a charging system configured to charge and discharge the test battery to provide a set of measurements of a battery cycle and the capacity of the test battery; a processor configured to extract the predetermined set of features from the set of measurements to submit the extracted set of features to the neural network, wherein the extracted set of features include a capacity, an internal resistance, a time interval of equal discharging voltage difference (TIEDVD), a capacity fade, a capacitance peak, and a voltage at capacitance peak of the test battery; and an output interface configured to output the estimated RUL of the test battery.

Another embodiment discloses a method for estimating a remaining useful life (RUL) of a test battery, the method comprising providing a set of measurements of battery cycle and a capacity of the test battery; extracting a predetermined set of features from the set of measurements to submit the extracted set of features to a neural network, wherein the extracted set of features include a capacity, an internal resistance, a time interval of equal discharging voltage difference (TIEDVD), a capacity fade, a capacitance peak, and a voltage at capacitance peak of the test battery and outputting the estimated RUL of the test battery.

Further features and advantages will become more readily apparent from the following detailed description when taken in conjunction with the accompanying drawings.

BRIEF DESCRIPTION OF THE DRAWINGS

The present disclosure is further described in the detailed description which follows, in reference to the noted plurality of drawings by way of non-limiting examples of exemplary embodiments of the present disclosure, in which like reference numerals represent similar parts throughout the several views of the drawings. The drawings shown are not necessarily to scale, with emphasis instead generally being placed upon illustrating the principles of the presently disclosed embodiments.

FIG. 11 shows a tabular representation of error results for Multivariable Linear Regression and Multi-Layer Perceptron, according to some embodiments of the present disclosure.

Figure 1:
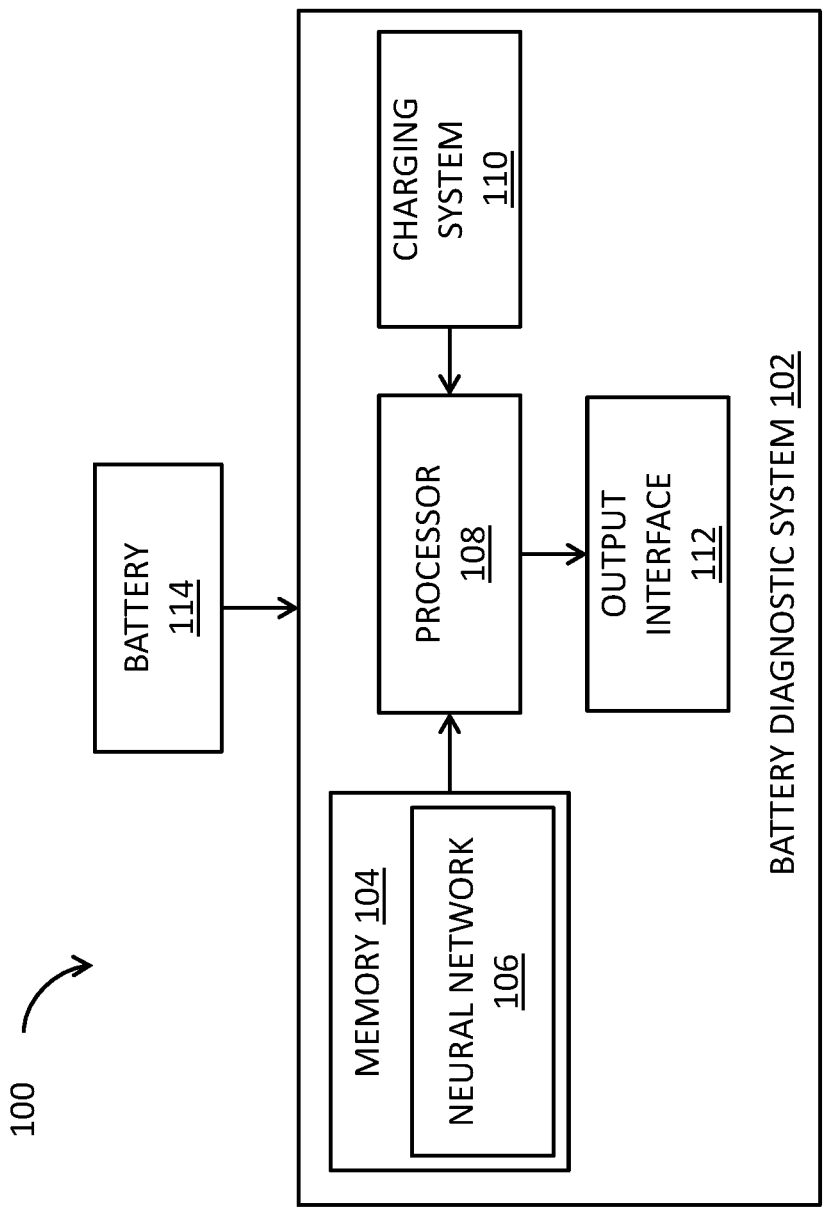
FIG. 1 shows a principle block diagram of a battery diagnostic system according to some embodiments of the present disclosure.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

In the following description, for purposes of explanation, numerous specific details are set forth in order to provide a thorough understanding of the present disclosure. It will be apparent, however, to one skilled in the art that the present disclosure may be practiced without these specific details. In other instances, apparatuses and methods are shown in block diagram form only in order to avoid obscuring the present disclosure.

As used in this specification and claims, the terms "for example," "for instance," and "such as," and the verbs "comprising," "having," "including," and their other verb forms, when used in conjunction with a listing of one or more components or other items, are each to be construed as open ended, meaning that the listing is not to be considered as excluding other, additional components or items. The term "based on" means at least partially based on. Further, it is to be understood that the phraseology and terminology employed herein are for the purpose of the description and should not be regarded as limiting. Any heading utilized within this description is for convenience only and has no legal or limiting effect.

Rechargeable batteries already used in electric vehicles may be reused in other applications (i.e., second-life applications), such as grid energy storage systems or the like. The used rechargeable batteries have a capability of electric energy storage. Such reusability of the rechargeable batteries prevents wastage of resources as well as reduces cost of manufacture of the electric vehicles and other devices. An accurate estimation of remaining useful life (RUL) of such used rechargeable batteries is crucial for the reusability, without requiring information on previous usage and performance of the rechargeable batteries. Some embodiments disclose a methodology for estimating the RUL of a test battery (i.e., a used rechargeable battery) for the second-life applications.

Overview

The proposed method and the battery diagnostic system is based on a training dataset of occasionally taken measurements, under the same conditions, of capacity and charge/discharge voltage/current of a certain number of batteries sharing the same chemistry and/or a manufacturer. For instance, the training dataset may comprise 124 batteries or cells, which undergo a few number of test cycles until their end-of-life. The proposed method includes extracting a set of features by processing waveforms corresponding to a set of measurements comprising voltage and charge measurements in the training dataset. Further, the set of measurements is used to train machine learning algorithms to classify the battery in short RUL and long RUL classes and predict the RUL cycles for the battery. In the operational/online stage, RUL of a test battery of unknown state of health and previous usage pattern, is predicted based on the extracted set of features that include a capacity, an internal resistance, a time interval of equal discharging voltage difference (TIEDVD), a capacity fade, a capacitance peak and a voltage at capacitance peak of a test battery/current measurements over a number of charge/discharge test cycles and the training dataset.

In one example embodiment, the training dataset may include a collection of dataset corresponding to 124 batteries that are used for the RUL estimation. The 124 batteries may include commercial LFP or graphite cells, that undergo a few number of test cycles until their end-of-life. In such dataset collection, waveforms corresponding to voltage and charge are measured for each test cycle of each type of battery or hereinafter interchangeably referred to cell. In some cases, a battery may be comprised of one cell. In such cases, the cell is evaluated through test cycles using the training dataset. In some other embodiments, the battery may comprise a collection of cells, where the cells are combined and undergo test cycles using the training dataset. Further, the training dataset provides an observed capacity and an estimate of an internal resistance of the battery (e.g., the battery 114) once for each cycle. Furthermore, each cycle in the training dataset is used instead of each battery for the RUL estimation of the battery for the second-life applications.

FIG. 1 shows a principle block diagram 100 of a battery diagnostic system 102, according to some embodiments of the present disclosure. The battery diagnostic system 102 includes a memory 104, a processor 108, a charging system 110, and an output interface 112. The battery diagnostic system 102 diagnoses a test battery, such as a battery 114 for predicting remaining useful life (RUL) of the battery 114. Examples of the battery 114 may include a Lithium-ion battery, Lithium Iron Phosphate (LFP), Lithium Nickel Manganese Cobalt Oxide (NCM or NCM), Lithium Nickel Cobalt Aluminum Oxide (NiNiCoAlO$_2$), Lithium-titanate battery or any other lithium based variants for rechargeable batteries. In some example embodiments, the battery 114 may correspond to a used battery that has been sent to a second-life market for repurposing in second-life applications.

The battery 114 is connected to the battery diagnostic system 102 via an input interface (not shown). The memory 104 is configured to store a neural network 106 trained to estimate an RUL of the battery 114. Further, the memory 104 may be configured to store a predetermined set of features indicative of a battery cycle of the battery 114 and a capacity of the battery 114. The predetermined set of features may include a current, a voltage, a capacity or the like. The battery cycle herein is formed by values of one or combination of voltages and currents measured for the battery 114 during one or combination of a charging cycle and a discharging cycle. To that end, the battery cycle corresponds to a charging cycle, a discharging cycle, or combination thereof that can be represented by measurements of voltage, current or combination thereof. For example, one embodiment uses voltage measurements of discharging cycles. Similarly, the measurements indicative of the capacity of the battery 114 may be the measurements of the capacity or any other measurements from which the capacity can be readily derived. For example, assuming the battery 114 was fully charged in the previous charging cycle, the current measured during the following discharging cycle is used to compute capacity of the battery 114. Analogously, assuming the battery 114 was fully discharged in the previous discharging cycle and gets fully charged in the current charging cycle, its capacity is proportional to the integral of the charge current over time during the charging cycle, with the same constant of proportionality depending on a battery type. Additionally, or alternatively, the memory 104 is also configured to store a pre-determined classification threshold value and a pre-determined optimal number of test cycles of the battery 114. The pre-determined classification threshold value is used for classifying the battery 114 and the pre-determined optimal number of test cycles is for performing the battery cycle of the battery 114. The charging system 110 is configured to charge and discharge the battery 114 to provide a set of measurements of the battery cycle and the capacity of the battery 114.

The processor 108 is configured to extract the predetermined set of features from the set of measurements. The processor 108 is further configured to submit the extracted set of features to the neural network in the memory 104. The extracted set of features include a capacity, an internal resistance, a time interval of equal discharging voltage difference (TIEDVD), a capacity fade, a capacitance peak and a voltage at capacitance peak of the battery 114. The neural network estimates the RUL of the battery 114, which is outputted in the output interface 112. In some example embodiments, the output interface 112 may include a display device to display the estimated RUL of the battery 114. The estimated RUL may be displayed as a number or count of life cycles (e.g., 100 RUL cycles, 300 RUL cycles), an RUL level (e.g., high RUL level or low RUL level), a percentage value of RUL (e.g., 30%, 70%), a color indication of RUL, or the like. In some other embodiments, the estimated RUL may be outputted as an audio output via the output interface 112.

In effect, some embodiments estimate the RUL, where a state of health and a previous usage pattern of the RUL are unknown. An application of the disclosed method is to predict the RUL of a battery cell, such as the battery 114 purchased from a second-life battery market based on the extracted set of features. The prediction is aided by the training dataset that provide measurements of the battery cycle and capacity/voltage/current measurements of a certain number of batteries. These batteries share the same manufacturer and chemistry, but undergo different usage patterns.

More specifically, embodiments provide a data-driven method to estimate the RUL of the battery 114, without requiring previous usage and performance information of the battery 114. For example, some embodiments use training batteries in different manners while occasionally performing measurements under the same conditions that force the batteries to get fully charged and/or discharged so as to obtain their capacity measurements. Such an approach allows to use the same conditions to measure, in operational or online stage, capacity and other measurements of the test battery 114 (of the same chemistry, manufacturer and model) of unknown previous usage pattern and to predict capacity degradation of the test battery over future charge-discharge cycles. Notably, the measurement condition for the test battery 114 can be controlled, while the usage pattern of a test battery is usually unknown. Additionally, some embodiments are based on recognition that for an estimation of RUL, the capacity is available as feature for the battery diagnostic system 102. For instance, when the battery 114 is not used in an online application, the test cycles is performed to obtain the capacity.

Figure 2:
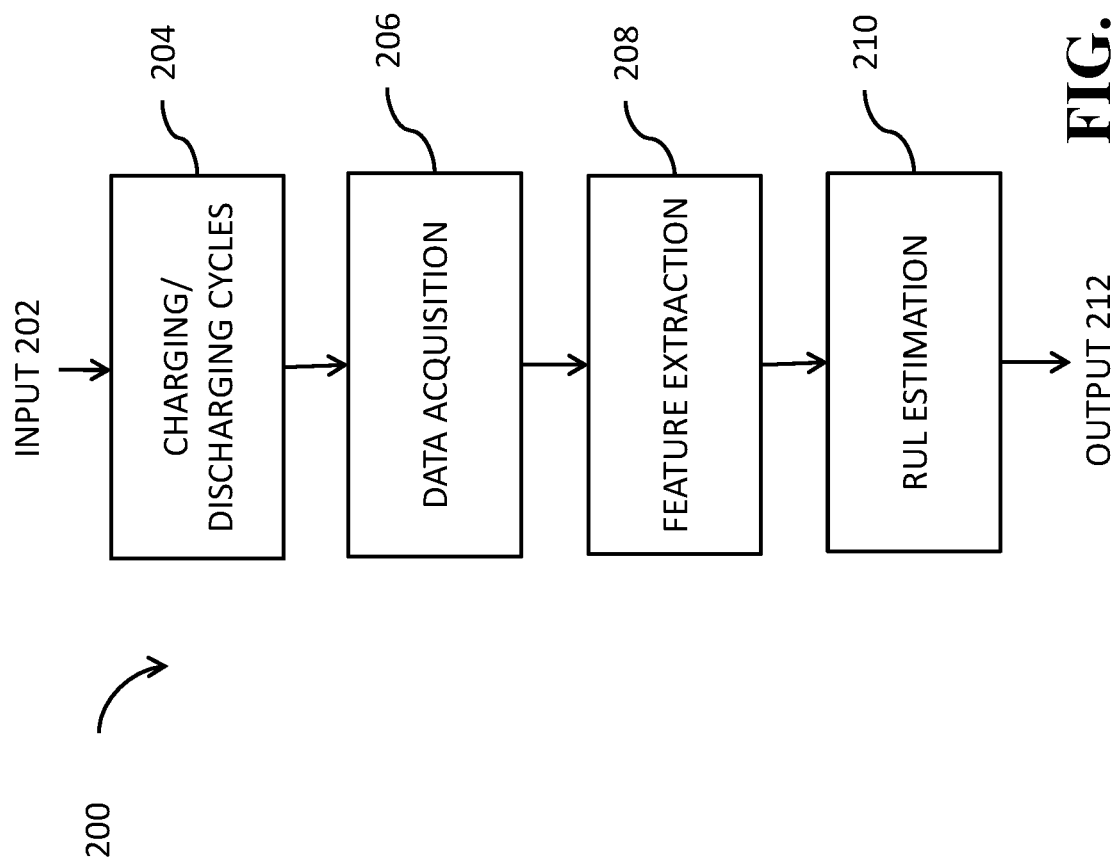
FIG. 2 shows a processing pipeline of the battery diagnostic system for estimating remaining useful life of a test battery, according to some embodiments of the present disclosure.

FIG. 2 shows a processing pipeline 200 of the battery diagnostic system 102 for estimating RUL of a test battery, e.g., the battery 114, according to some embodiments of the present disclosure. The RUL of a battery (such as the battery 114) herein is the number of second-life cycles that the battery 114 can last. The RUL is estimated without prior usage pattern and state of health in previous life of the battery 114. To that end, a training dataset of capacity, voltage and current measurements taken under same conditions of a certain number of batteries of same type (e.g., sharing the same chemistry and a manufacturer), is provided as input 202 for performing test cycles of the battery 114. Each test cycle in the training dataset is considered instead of each cell for an accurate RUL estimation of the battery 114, without the previous usage pattern and state of health of the battery 114. The processing pipeline 200 includes operations 204-210 performed by the battery diagnostic system 102 for providing an estimated RUL of the battery 114.

At operation 204, the charging system 110 runs a sequence of charge-discharge cycles for the battery 114. The sequence of charge-discharge cycles 202 is performed as test cycles using the input 202 (i.e., the training dataset). For instance, a number test cycles, denoted by $\delta$ is performed to the battery 114. The test cycles provide waveforms corresponding to voltage and charge features of the battery 114.

At operation 206, the charging system 110 acquires data comprising a set of measurements. For the $\delta$ test cycles, a set of measurements (e.g., $\delta$ measurements) are obtained. For instance, when test cycles $\delta=10$, features from the voltage and charge waveforms of these 10 test cycles are extracted. The features include a capacity, an internal resistance (IR), a time interval of equal discharging voltage differences (TIEDVD), a capacity fade ($\Delta C$), a capacitance peak ($C_{pk}$) and a voltage at capacitance peak ($V_{pk}$) of the battery 114. Thus, the set of measurements 204 include 10 measurements from each of the features except for the $\Delta C$. A measurement for the capacity fade feature is obtained by comparing capacity between the $10^{th}$ test cycle and $1^{st}$ test cycle. Further, difference in the capacities is determined based on the comparison. Therefore, for the capacity fade feature ($\delta$-1) measurements (i.e., 9 measurements are obtained). For instance, measured capacity of the battery 114 for 10 test cycles, $C=[C_0, C_1, C_2, C_3, C_4, C_5, C_6, C_7, C_8, C_9]$. Then, measurement of $\Delta C$ for 10 test cycles=$[C_1-C_0, C_2-C_0, C_3-C_0, C_4-C_0, C_5-C_0, C_6-C_0, C_7-C_0, C_8-C_0, C_9-C_0]$.

The charging system 110 provides the set of measurements to the processor 108.

At operation 208, the processor 108 performs a feature extraction operation to extract a predetermined set of features, such as features of capacity, internal resistance, TIEDVD, the capacity fade, the capacitance peak and a voltage at capacitance peak of the battery 114. The processor 108 submits the extracted set of features to the neural network 106.

At operation 210, the neural network 106 classifies the battery 114 for estimation of an RUL for the battery 114. In some embodiments, the neural network 106 includes an RUL classifier. The RUL classifier corresponds to, e.g., a logistic regression based classifier that classifies the battery 114 into a short RUL class or a long RUL class in dependence of the number of remaining cycles of the battery. For example, in some implementations, the short RUL class defines the battery with less than 150 remaining cycles, and the long RUL class defines the battery with more than 150 remaining cycles. The number of 150 cycles is determined through regression analysis to improve the performance of RUL estimation. The logistic regression based classifier is based on a regularized based algorithm that prevents the classification from overfitting the extracted set of features. Further, the RUL classifier computes a probability value for the battery 114 based on the extracted set of features. The probability value is compared with a pre-determined classification threshold value and the battery 114 is classified based on the comparison. In an illustrative example scenario, the probability value for the battery 114 is computed within the range [0, 1]. The computed probability value is compared with the pre-determined classification threshold value, such as 0.5 to classify the battery. For instance, the computed probability value is 0.3, the battery 114 belongs to the short RUL case as the probability value, i.e. 0.3 is less than the pre-determined classification threshold value of 0.5. If the probability value of the battery 114 exceeds the pre-determined classification threshold value the battery 114 belongs to the long RUL class. For instance, if the computed probability value is 0.7, the battery 114 belongs to the long RUL class as 0.7 is more than the pre-determined classification threshold value of 0.5. The neural network 106 estimates the RUL of the battery 114 based on the classification. The estimated RUL is provided to the processor 108. The processor 108 further provides the estimated RUL as output 212 via the output interface 112.

Selection of Features

Figure 3A:
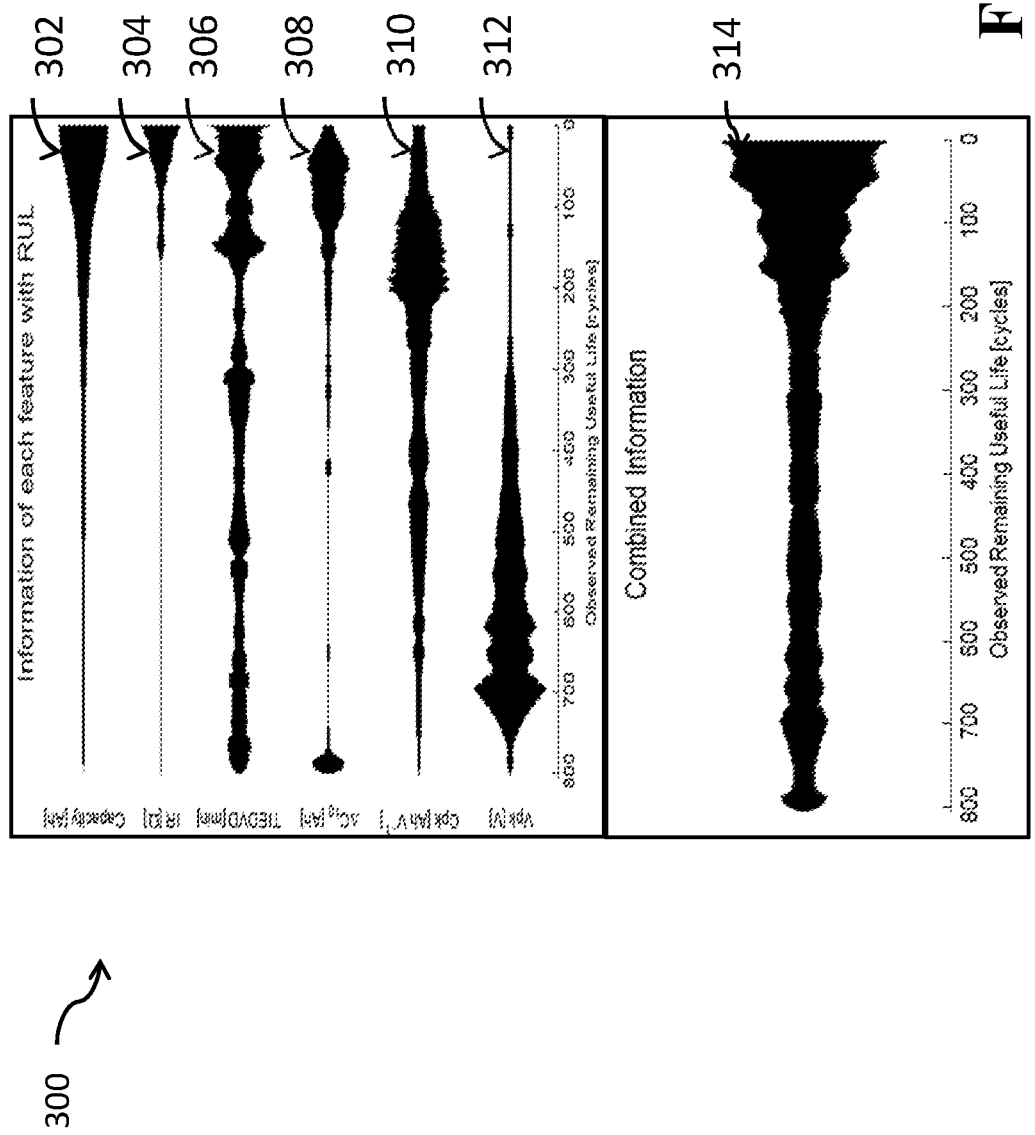
FIG. 3A shows a graphical representation of the variability of each feature along the lifespan of a battery, as a measurement of the amount of information each feature provides, according to some embodiments of the present disclosure.

FIG. 3A shows a graphical representation 300 of the variability of each feature along a lifespan of the battery 114, as a measurement of amount of information each feature provides, according to some embodiments of the present disclosure. The graphical representation 300 includes a capacity (C) waveform 302, an internal resistance (IR) waveform 304, a TIEDVD waveform 306, a capacity fade ($\Delta C$) waveform 308, a capacitance peak ($C_{pk}$) waveform 310, and a voltage at capacitance peak ($V_{pk}$) waveform 312. The capacity of the battery 114 is measured in Ampere-hour (Ah), the IR is measured in $\Omega$, the TIEDVD is measured in minute (min), the $\Delta C$ is measured in Ah, the $C_{pk}$ is measured in Ah $V^{-1}$ and the $V_{pk}$ is measured in voltage V. Each of the waveforms 302-312 provides information, such as measurements of each of the features in different moments/stages of the RUL of the battery 114. For instance, at end-of-life (EoL) of the battery 114, the capacity waveform 302, the IR waveform 304, the TIEDVD waveform 306, the $\Delta C$ waveform 308 and the $C_{pk}$ waveform 310 show that corresponding features of C, IR, TIEDVD, $\Delta C$ and $C_{pk}$ provide more information. As the battery 114 ages, the features C, IR, TIEDVD, $\Delta C$ and $C_{pk}$ become relevant.

As shown in FIG. 3A, information on the features of capacity and internal resistance may not be useful, when life of the battery 114 is young (i.e., not used). The $\Delta C$ waveform 308 provides less information on the capacity fade feature at the beginning of life, no information in middle life and more information at the EoL. Further, the TIEDVD waveform 306 and the $V_{pk}$ waveform 312 of $V_{pk}$ exhibit different characteristics at the EoL of the battery. The features of TIEDVD provide some information along all lifespan of the battery 114, though a little higher at the EoL. The $V_{pk}$ waveform 312 shows that the $V_{pk}$ provides more information at the beginning of life of the battery 114 and almost no information at the EoL. The $C_{pk}$ waveform 310 and $V_{pk}$ waveform 312 are complementary to each other, as shown in FIG. 3A. As each of the waveforms 300 exhibit different characteristics, the feature waveforms 302-312 are combined into a waveform 314 which provide combined information as the RUL of the battery 114. Additionally, the addition of the information of the features into the waveform 314 indicates that at each stage of the RUL has sufficient information from one of the feature waveforms 302-312. In the waveform 314 it can be appreciated how there is information for RUL determination along all the lifespan of the battery 114 provided at least from one or more of the features 302-312.

Each of the features (e.g., the C, IR, TIEDVD, $\Delta C$, $C_{pk}$ and $V_{pk}$) evolving at different stages is further described with reference to FIG. 3B.

Figure 3B:
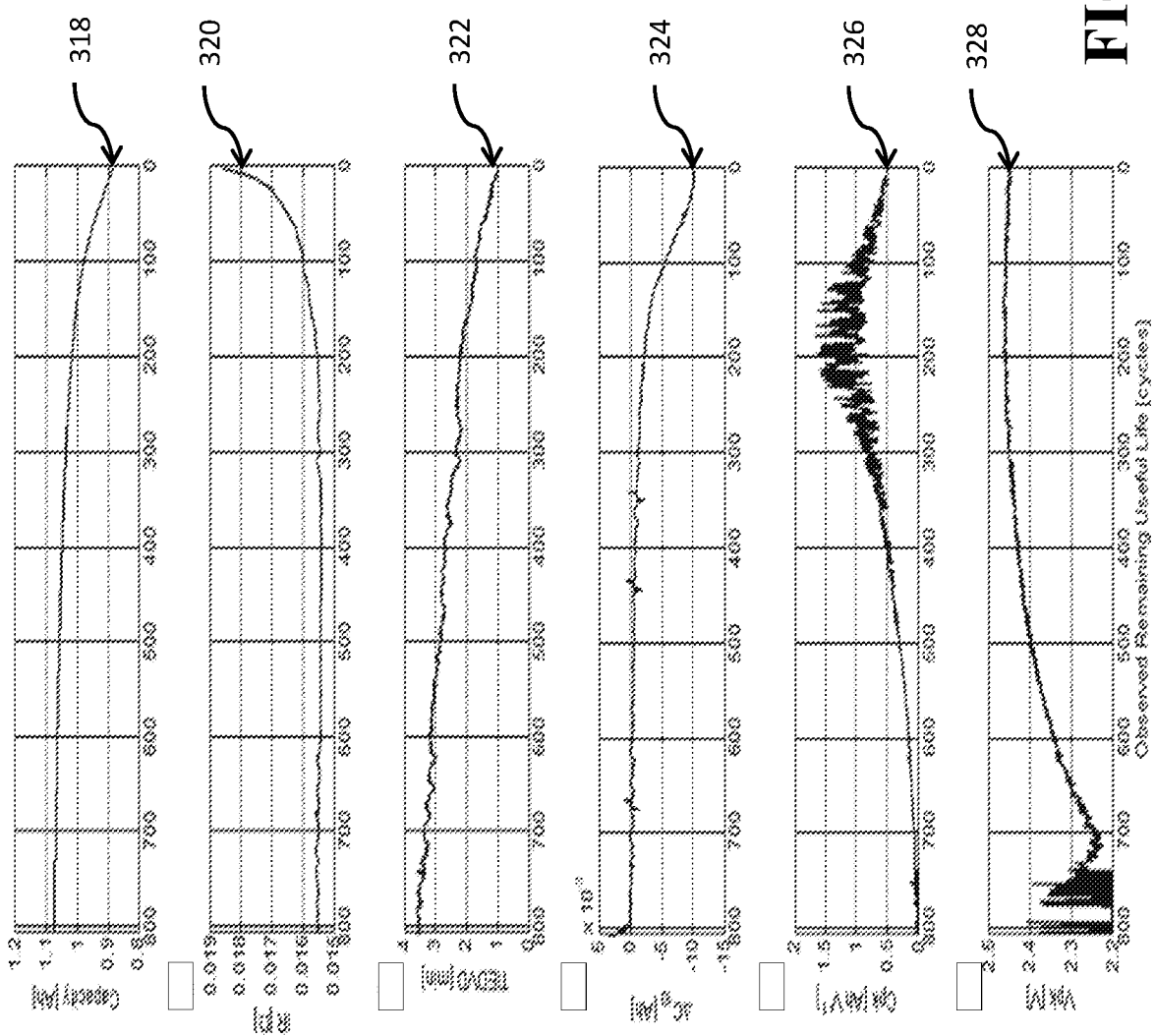
FIG. 3B shows a graphical representation depicting evolution of each waveform of each of the features, according to some embodiments of the present disclosure.

FIG. 3B shows graphical representations depicting evolution 316 of each corresponding feature, a capacity feature 318, an IR feature 320, a TIEDVD 322, a capacity fade (AC) feature 324, a capacitance peak ($C_{pk}$) feature 326 and a voltage at capacitance peak ($V_{pk}$) feature 328 with an RUL for one cell of the battery 114, according to some embodiments of the disclosure. The capacity feature 318 provides a total amount of charge extracted in one complete discharge cycle of the battery 114. The IR feature 320 (in ohms, $\Omega$) is measured for each battery cycle. One measurement per cycle is included in the training dataset, which is obtained by averaging ten current pulses at 80% of State of Charge (SoC). As shown in FIG. 3B, the IR feature 320 increases abruptly when the battery 114 is near its EoL. The TIEDVD feature 322 is a time lapse between two voltage thresholds ($V_{max}$, $V_{min}$), while discharging a constant current and a known current. The TIEDVD 322 evolves linearly with the battery life and some noise. The time lapse may be measured in seconds, minutes, or the like. As shown in FIG. 3B, most significant changes to the capacity feature 318, the IR feature 320 and the $\Delta C$ feature 324 occur in last 100-200 cycles of the battery 114. The $\Delta C$ feature 324 relates to variation in capacity between two consecutive cycles of the battery 114. The $\Delta C$ feature 324 is used to determine variations in the initial capacity of cells (due to manufacturing processes) and prevent concluding that the battery 114 is aged. Further, there is a rapid decay in capacity after some consecutive cycles of the battery 114. The rapid decay is helpful in determining an aged battery, a new battery or a battery with less number of cycles.

Further, both the $C_{pk}$ feature 326 and the $V_{pk}$ feature 328 exhibit a trend different from each of the capacity feature 318, the IR feature 320, TIEDVD 322, and the $\Delta C$ feature 324. As shown in FIG. 3B, changes in the $C_{pk}$ feature 326 and the $V_{pk}$ feature 328 are seen in middle life of the battery 114. The Cpk feature 326 evolves along battery life, increasing in earlier number of cycles, such as first hundreds of cycles and decreasing in remaining cycles. The $V_{pk}$ feature 328 also varies with life of the battery 114. In the first 80 cycles of life, the $V_{pk}$ feature 328 is not so significant. However, the $V_{pk}$ feature 328 becomes relevant when the battery 114 approaches the EoL.

Some embodiments are based on realization that a feature of battery 114, i.e. the TIEDVD feature 322 exhibits time interval for discharging voltage from maximum to minimum when the battery 114 is new. The TIEDVD parameter is defined as the time interval corresponding to a certain discharging voltage difference. The indicated degradation based on the TIEDVD parameter is similar to that of battery capacity as well as RUL, which is described further with reference to FIGS. 4A and 4B.

Figure 4A:
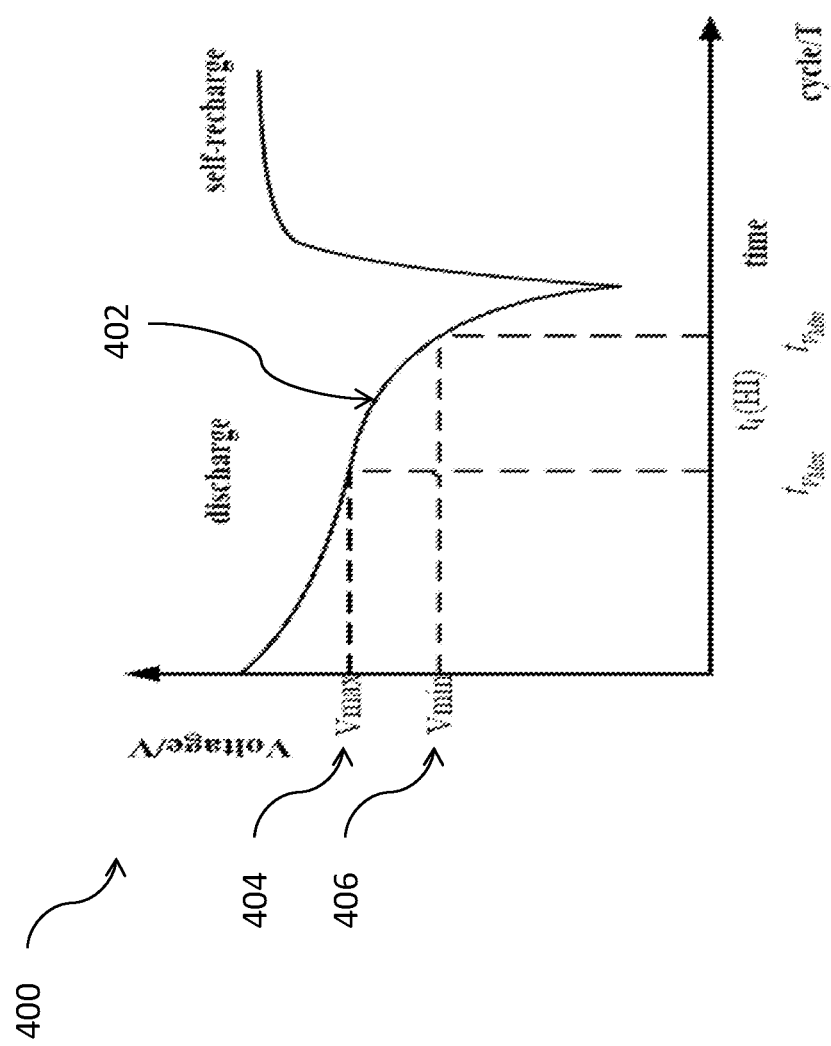
FIG. 4A shows a graphical representation depicting a discharge curve for feature of time interval of equal discharging voltage differences (TIEDVD), according to some embodiments of the present disclosure.

FIG. 4A shows a graphical representation 400 depicting a discharge curve 402 for the extraction of feature TIEDVD 322, according to some embodiments of the present disclosure. The discharge curve 402 corresponds to a time (cycle/

T) in a horizontal axis and a voltage (voltage/V) in a vertical axis. For instance, in the discharge curve 402, the voltage (voltage/V) is discharged in its whole range, and the time from a maximum voltage ($V_{max}$) level 404 to a minimum voltage ($V_{min}$) level 406 is measured in a time interval $t_i$ (HI). The time interval $t_i$ (HI) is the difference between a time instant $tv_{max}$ and a time instant $tv_{min}$, where the time instant $tv_{max}$ may correspond to a time instant at which the voltage (voltage/V) reaches $V_{max}$ level 404 and the $tv_{min}$ may correspond to a time instant at which the voltage (voltage/V) reaches at $V_{min}$ level 406. This $t_i$ (HI) feature is the TIEDVD feature 322 for this specific cycle. Considering that the battery 114 is new, the time interval (cycle/T) decreases linearly as the battery 114 ages. In some cases, the $V_{max}$ level 404 and the $V_{min}$ level 406 may depend on specific chemistry of the battery 114. In some example embodiments, the $V_{max}$ level 404 may correspond to 3.3V and the $V_{min}$ level 406 may correspond to 3.15V of the battery 114.

Figure 4B:
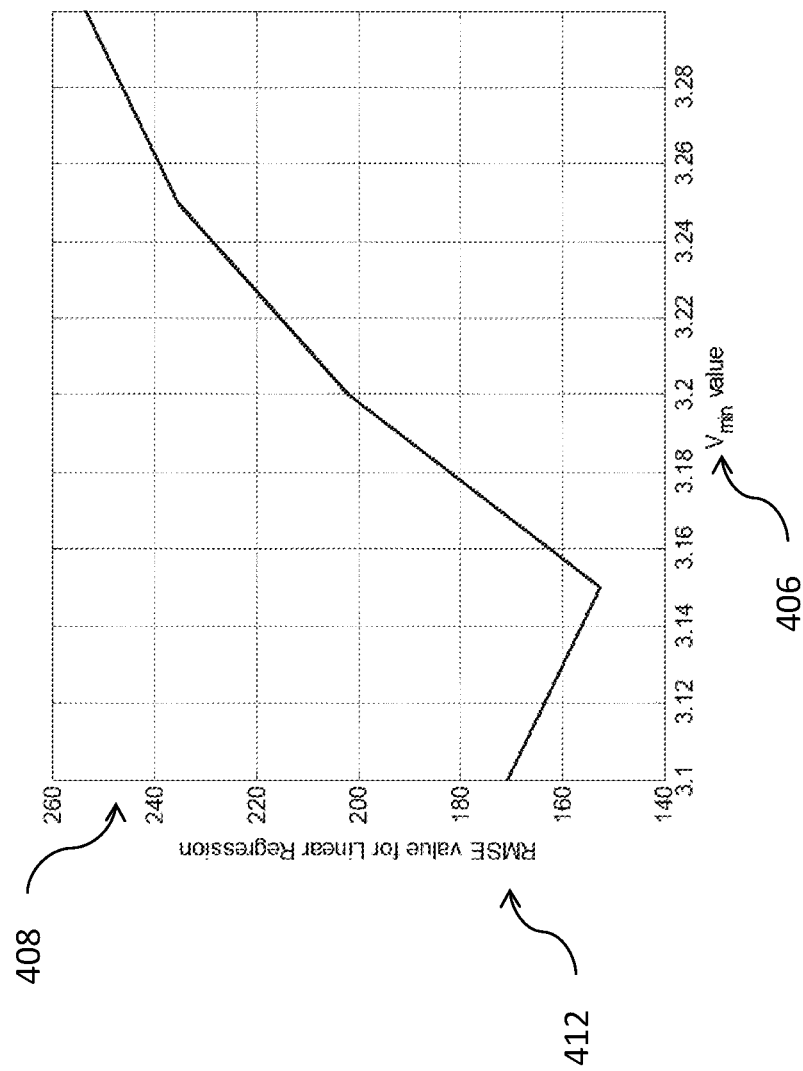
FIG. 4B shows a graphical representation for selecting the voltage threshold for determining the TIEDVD feature, according to some embodiments of the present disclosure.

FIG. 4B shows a schematic of selecting minimum voltage for determining TIEDVD according to some embodiments. A graphical representation 408 depicts the analysis of a root mean squared error (RMSE) value for linear regression 412 of RUL based on the TIEDVD feature 322 as dependent on the minimum voltage ($V_{min}$) level 406. The value for the minimum voltage ($V_{min}$) level 406 is selected by minimizing the root mean squared error (RMSE) value for linear regression 412.

Figure 4C:
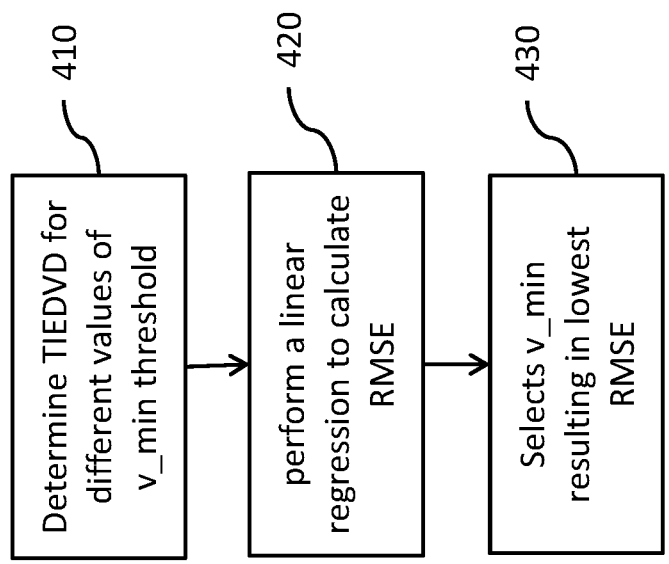
FIG. 4C shows a flow chart of a method for selecting a TIEDVD threshold according to one embodiment of the present disclosure.

FIG. 4C shows a flow chart of a method for selecting a TIEDVD threshold according to one embodiment. In this exemplar embodiment, the method selects a value of the v_min parameter shown in relation to FIG. 4B. The selected value of v_min parameter increases the accuracy of RUL estimation. The method can be executed in advance based on a set of training data that include pairs of cell measurements and ground truth RUL values. For each value of v_min under consideration, the converts 410 the voltage discharge curve measurements to TIEDVD features, as described in relation to FIG. 4A. Next, for each value of v_min under consideration, the method performs 420 a linear regression for estimating the RUL from the TIEDVD feature, and calculates the associated root mean squared error (RMSE) for that linear regression. The method selects 430 the value of v_min that results in the lowest RMSE.

In a similar manner, a small disturbance appears in the low voltage part of discharge waveform that generates the $C_{pk}$ feature 326 as the battery 114 ages, which is further described with reference to FIG. 5 and FIG. 6.

Figure 5:
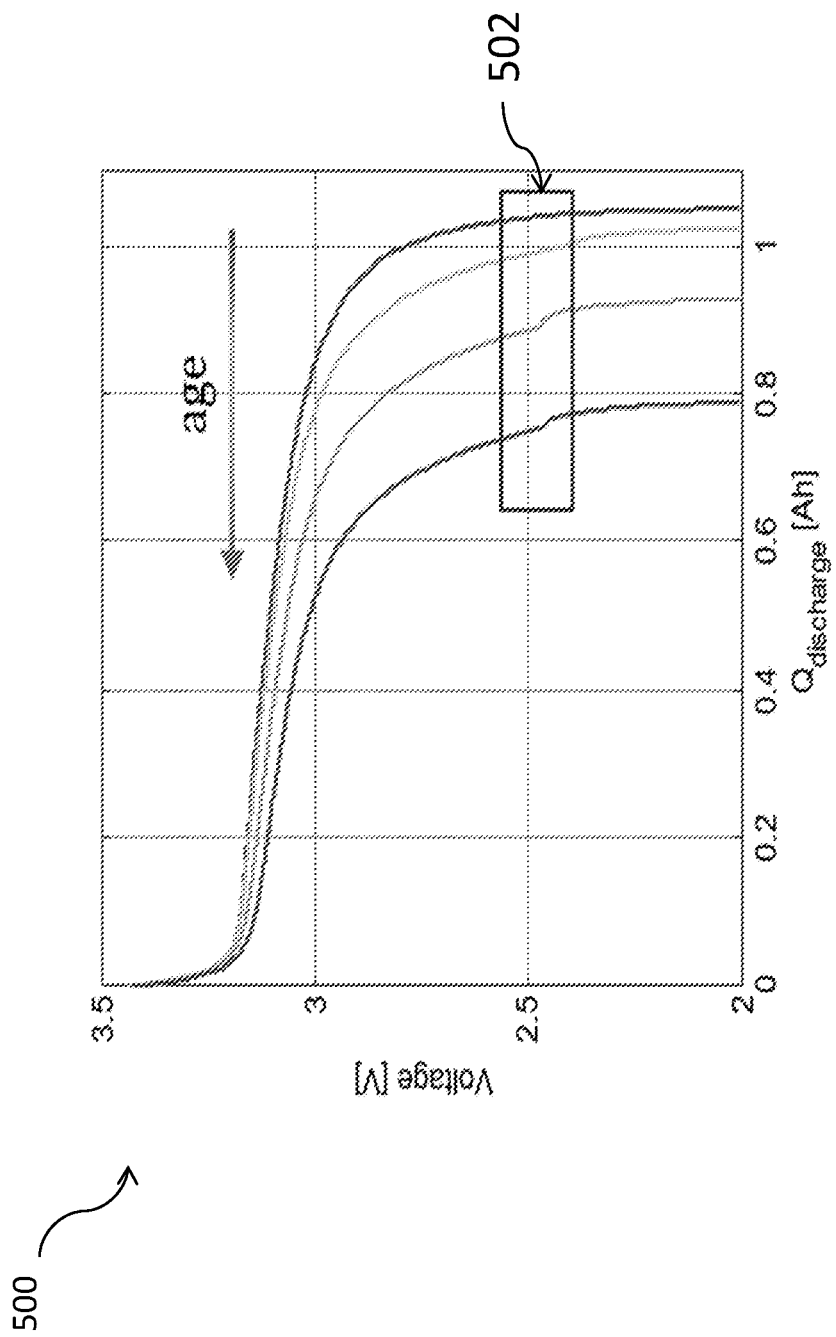
FIG. 5 shows a graphical representation depicting capacitance peak advent of voltage against charge waveform and variations of the charge waveform as the battery ages, according to some embodiments of the present disclosure.

FIG. 5 shows a graphical representation 500 depicting capacitance peak advent of voltage against discharge ($Q_{discharge}$) waveform and variations of the discharge waveform 502 as the battery 114 ages, according to some embodiments of the present disclosure. As the battery 114 ages, a small disturbance appears in a low voltage part of a discharge waveform. The disturbance grows until a certain moment in life of the battery 114, and becomes smoother when the battery 114 approaches the EoL. Further, a peak, in the battery equivalent capacitance (i.e., the $C_{pk}$) is generated due to the disturbance growth, which is shown in FIG. 6.

Figure 6:
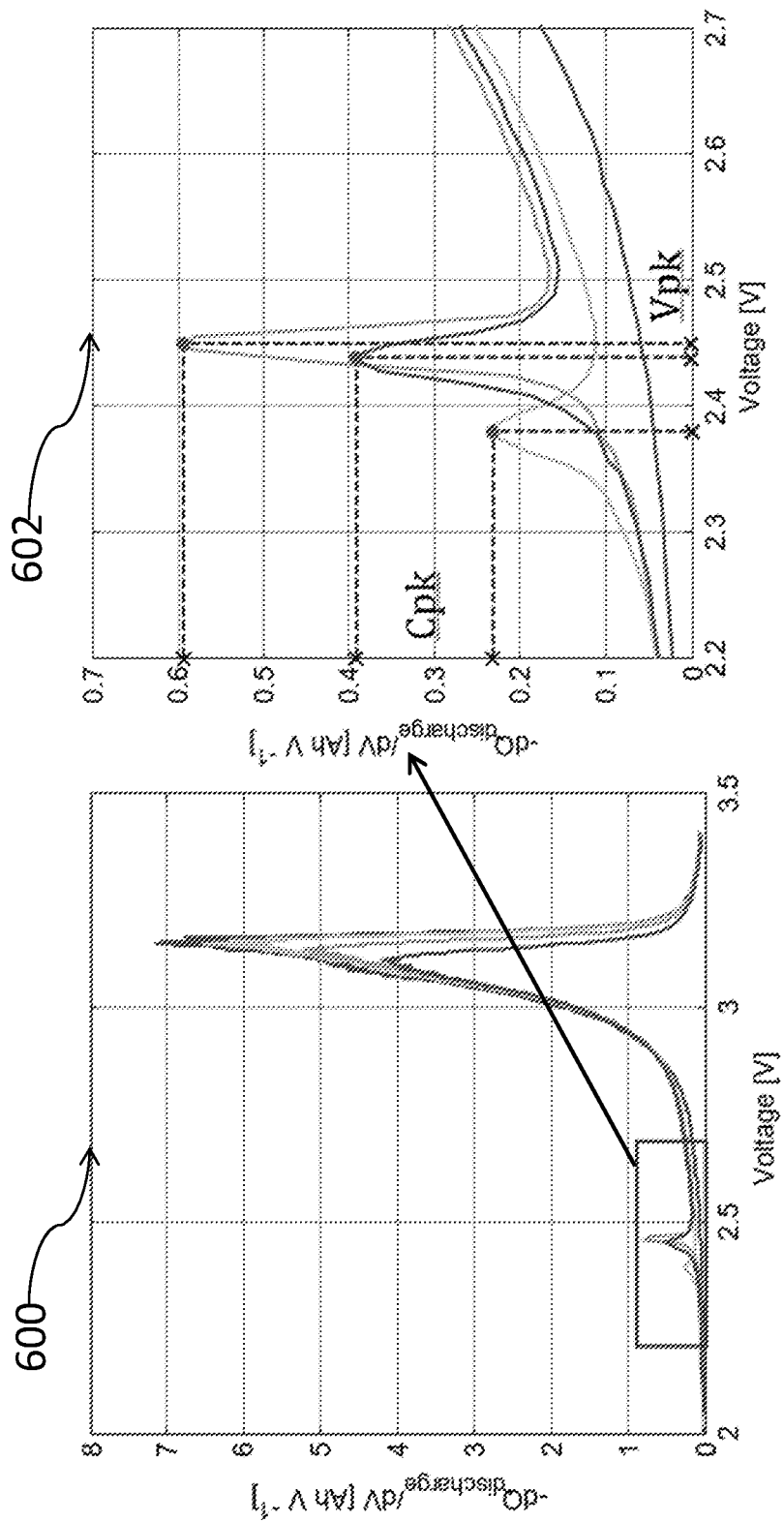
FIG. 6 shows a graphical representation depicting charge derivative with respect to voltage and variations of the voltage as the battery ages, according to some embodiments of the present disclosure.

FIG. 6 shows a graphical representation 600 depicting charge derivative with respect to voltage and variations of the voltage as the battery 114 ages, according to some embodiments of the present disclosure. In some embodiments, determination of a charge derivative with respect to voltage and the variations of the voltage is performed during test cycles of the battery 114 by the charging system 110.

The charging system 110 may determine the variations of the voltage based on an incremental capacity (IC) analysis. In the IC analysis, properties of the battery 114 (e.g., properties related to chemistry of the battery 114, such as oxidation potential, reduction potential, or the like) are tracked. During the IC analysis, a disturbance appears as a small peak, such as peak 602 in a low-voltage region, as shown in FIG. 6. The value of the peak is the capacitance peak feature 326 for that cycle, and the voltage at which the peak is located is the voltage at capacitance peak feature 328 for that cycle.

RUL Classification

Figure 7:
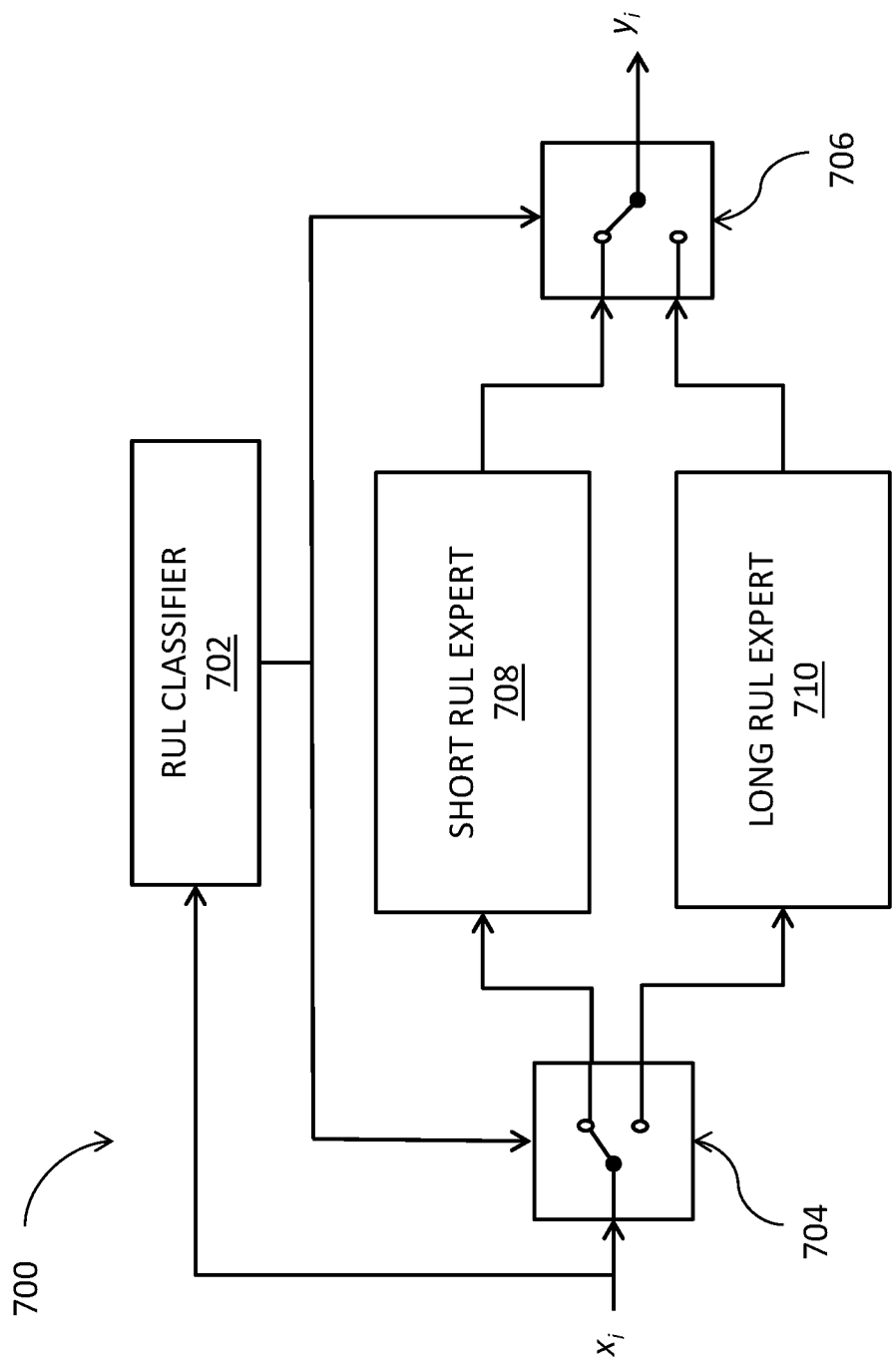
FIG. 7 shows a block diagram of a multiple expert system for classifying the battery, according to some embodiments of the present disclosure.

FIG. 7 shows a block diagram of a multiple expert system 700 for classifying the battery 114, according to some embodiments of the present disclosure. The neural network 106 stored in the memory 104 may include the multiple expert system 700 that comprises an RUL classifier 702, an input unit 704, and an output unit 706. Further, the multiple expert system 700 comprises a short RUL expert 708 and a long RUL expert 710. The RUL classifier 702 may include a set of executable instructions such as shallow machine learning algorithms, to classify the battery 114. Some embodiments are based on a realization to execute the set of executable instructions of the RUL classifier 702 based on a pre-determined classification threshold value in order to classify the battery.

The selected features that are the capacity feature 318, the IR feature 320, TIEDVD 322, and the ΔC feature 324, the $C_{pk}$ feature 326, and the $V_{pk}$ feature 328 (also called as features 318-328) of the battery 114 are provided as input ($x_i$) to the RUL classifier 702. The RUL classifier 702 corresponds to a logistic regression algorithm for classifying the battery 114 into a short RUL class or a long RUL class. The logistic regression based RUL classifier 702 is regularized to prevent the classification of the battery 114 from overfitting the selected set of features (i.e., the features 318-328). Accordingly, the RUL classifier 702 corresponds to a regularized logistic regression. The regularized logistic regression may be expressed as, $$\hat{y}(x, w) = \frac{1}{1 + e^{-w^T x}} \quad (1)$$

where,
$\hat{y}$ is predicted output providing the probability value for the battery 114 to belong to a short RUL class and a long RUL class,
x is an n-dimensional feature array, and
w is a n-dimensional weight array.

The regularized logistic regression provides regularization on weights in the weight array, w. The regularization prevents the logistic regression algorithm from overfitting the features (e.g., the features 318-326).

An output class (i.e., one of the short RUL class or the long RUL class) is obtained based on the output of the classifier. The output class is provided to the output unit 706. The logistic regression algorithm fits w by minimizing the cost function in (2).

$$J(w) = \frac{1}{m}\sum_{i=1}^{m}(E(x_i, w, y_i)) + \lambda \sum_{j=1}^{n} w_j^2 \quad (2)$$

In equation (2), $\sum_{i=1}^{m}(E(x_i,w,y_i))$ represents traditional cost function for conventional logistic regression, and $\sum_{j=1}^{n} w_j^2$ represents Ridge regularization. The Ridge regularization enables the RUL classifier 702 less prone to overfitting. More specifically, the Ridge regularization prevents large weights by setting a penalty on those weights with large values. The penalty may be set on squared values of the large weights. This reduces the large weights to smaller values. The parameter 'm' represents a number of examples in the training dataset, represents a regularization parameter and $E(x_i,w,y_i)$ is an error function representing a traditional cost function used for conventional logistic regression, given by (3):

$$E(x_i,w,y_i)=-y_i \log(\hat{y}(x_i,w))-(1-y_i)\log(1-\hat{y}(x_i,w)) \quad (3)$$

In operation, the RUL classifier 702 classifies the battery 114 based on the input $x_i$. The battery 114 is classified as the short RUL class or the long RUL class based on the logistic regression algorithm. The RUL classifier 702 further provides the classified input $x_i$ to the input unit 704. The input unit 704 provides the classified input $x_i$ to the short RUL expert 708 or the long RUL expert 710 based on the classification.

In some example embodiments, the RUL classifier 702 classifies the battery 114 by comparing 9 with a pre-determined classification threshold value. The classification threshold value is determined based on an optimal number of test cycles. The optimal number of test cycles is pre-determined by the logistic regression algorithm.

Determining Optimal Number of Test Cycles

Typically, a larger number of test cycles (denoted by δ) allows gathering more information about the RUL of the battery 114, denoted by equation (4):

$$n_{measurements}=6\delta-1 \quad (4)$$

For a specific number of test cycles δ, such as 10 test cycles, provides δ measurements (i.e., 10 measurements) for each feature except ΔC feature 322. However, this comes at an expense of reducing the RUL for the test purposes. Thus, there is a tradeoff between the number of test cycles and the success rate achieved. To determine the optimal number of test cycles, the logistic regression algorithm is executed as an initial algorithm for the classification of the battery 114.

Figure 8A:
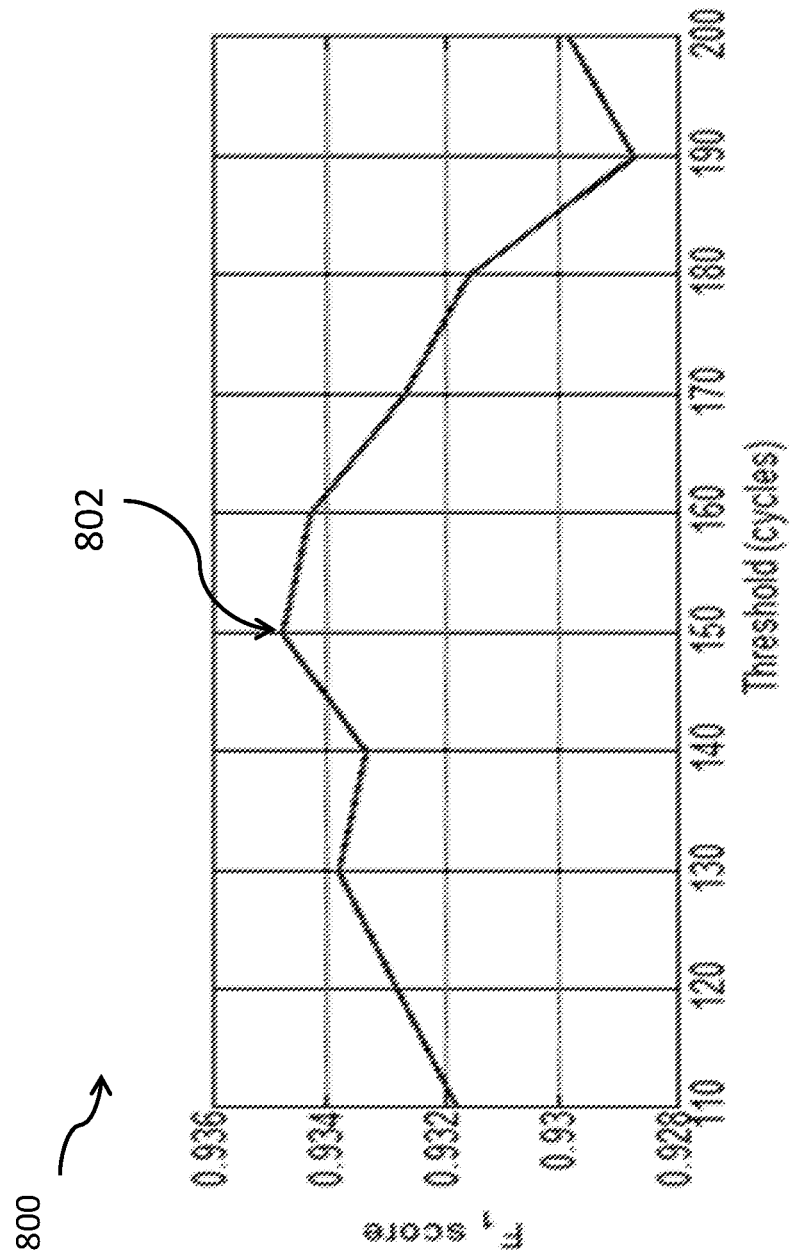
FIG. 8A shows a graphical representation of a predetermined threshold classification value for the classification of the battery, according to one example embodiment of the present disclosure.

In one example embodiment, the classification threshold value is pre-determined based on 150 RUL cycles as the optimal number of cycles, which is described further with reference to FIG. 8A.

FIG. 8A shows a graphical representation 800 of a pre-determined threshold classification value for the classification of the battery 114, according to one example embodiment of the present disclosure. As shown in FIG. 8A, the graphical representation 800 corresponds to an F1 score metric on a vertical axis for different threshold values with the classification algorithm and the optimal number of cycles on a horizontal axis is established in 150 RUL cycles (e.g., peak 802). The F1 score metric provides a measure on accuracy for the classification with different threshold values (e.g., 100 cycles, 150 cycles, 200 cycles). In some example embodiments, different sets of variables for δ measurements are tested. The set of variables may include and/or exclude one or more of the features 318-326.

Figure 8B:
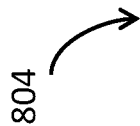
FIG. 8B shows a tabular representation of the features used for the RUL estimation, with delta being the number of test cycles to be conducted, according to some embodiments of the present disclosure.

FIG. 8B shows a tabular representation 804 of the features used for the RUL estimation, according to some embodiments of the present disclosure. As shown in FIG. 8B, the table 804 makes a total of 4δ measurements. Here, the Cpk feature 324 and the $V_{pk}$ feature 324 may be combined into a single feature (i.e., a feature 806).

Further, the logistic regression algorithm used for the classification of the battery 114 by the RUL classifier 702 as well as for the determination of the optimal number of test cycles, is evaluated for different test cycle values. The evaluation is based on results of success rate for the classification task of the RUL classifier 702, which is described further with reference to FIG. 9.

Figure 9:
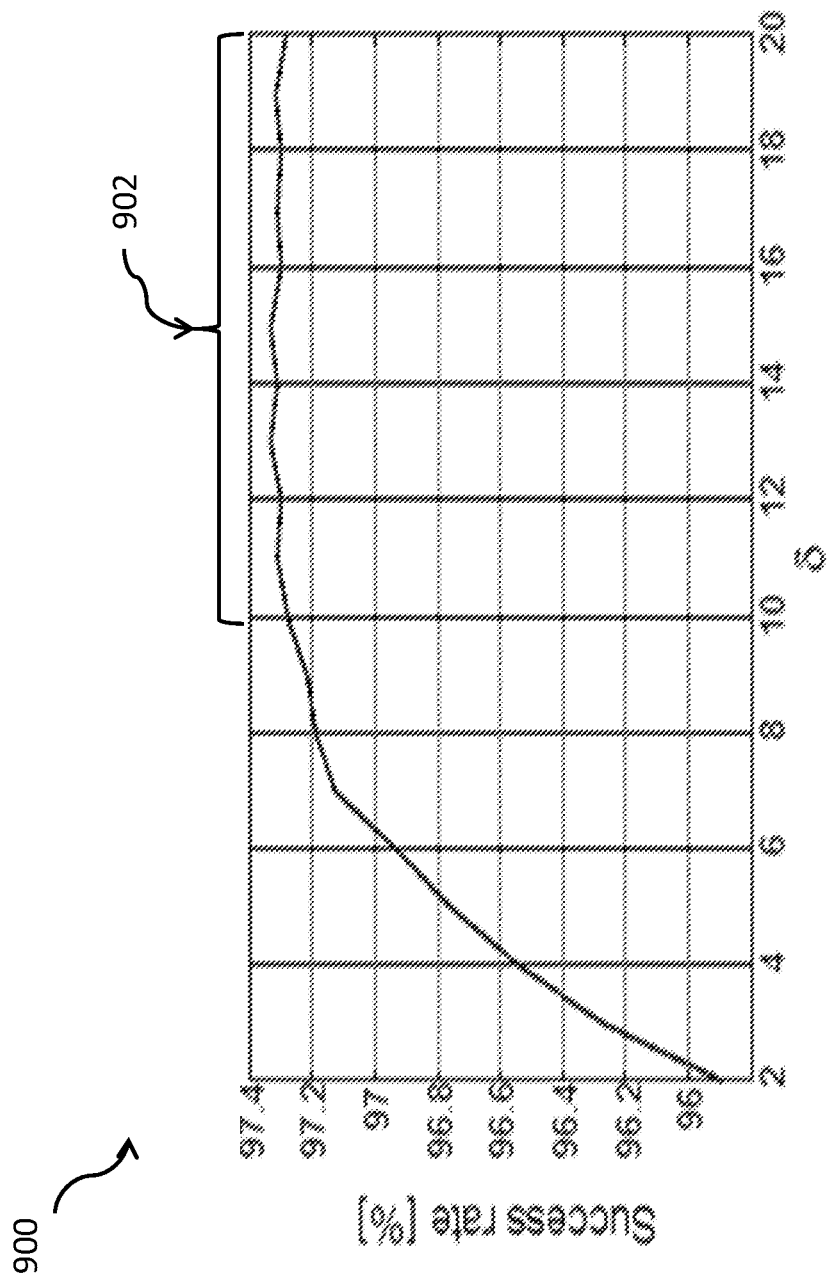
FIG. 9 shows a graphical representation depicting results on success rate for the logistic regression algorithm for each number of test cycles of the battery, according to one example embodiment of the present disclosure.

FIG. 9 shows a graphical representation 900 depicting results on success rate for each number of test cycles of the battery 114, according to one example embodiment of the present disclosure. In one example embodiment, the logistic regression algorithm is evaluated for different test cycle δ values, with 60% of the training dataset for training, 20% for cross-validation, and 20% for testing. As shown in FIG. 9, values of test cycles 902 remains constant for δ above 10. This indicates that the values of test cycles 902 impact on improvement in accuracy of the logistic algorithm for the classification. Therefore, the test cycle, δ=10 is determined as the optimal number of cycles based on the evaluation of the logistic regression algorithm. Further, overall accuracy of the classification of the battery 114 (i.e., the classification of the battery 114 into the short RUL or the long RUL) is evaluated using a confusion matrix, which is described further with reference to FIG. 10.

Figure 10:
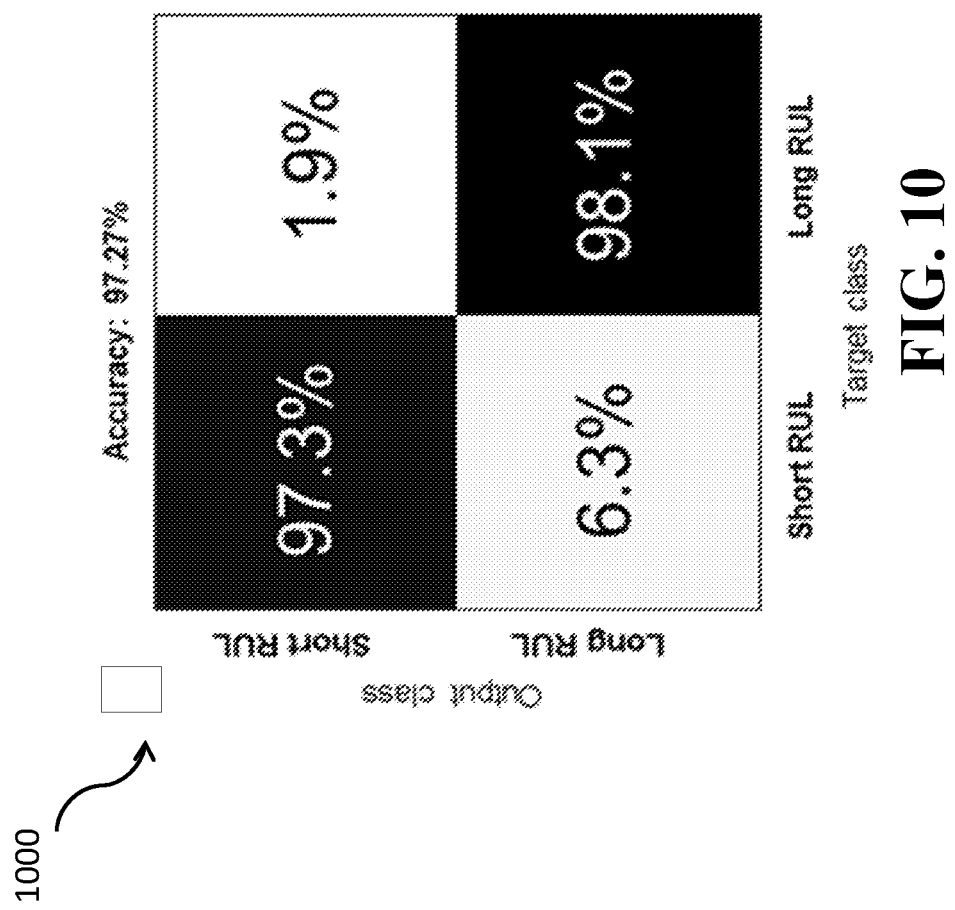
FIG. 10 shows a confusion matrix for the logistic regression algorithm, according to one example embodiment.

FIG. 10 shows a confusion matrix 1000 for the logistic regression algorithm corresponding to classification of the battery 114 to a short RUL or a long RUL, according to one example embodiment. As shown in FIG. 10, the overall accuracy in the classification obtained is around 97.27%, with 93.7% accuracy for detecting "Short RUL", and 98.1% accuracy for "Long RUL". This high accuracy for the battery 114 is achieved in an unknown moment of battery life of the battery 114. That is, it is unknown how many cycles of the battery 114 have been used prior to measurements in test cycles of the battery 114.

RUL Estimation

Furthermore, the battery diagnostic system 102 performs actual RUL estimation of the battery 114 based on the classification of the battery 114 by the RUL classifier 702. The RUL estimation herein corresponds to a direct RUL estimation approach. The RUL estimation is initiated when the processor 108 submits the selected set of features 318-326 to the neural network 106. In some embodiments, the neural network 106 corresponds to a multivariable linear regression (MLR) algorithm. The MLR algorithm computes a predicted output for the set of features 318-326 as an input array, by equation (5):

$$\hat{y}(x,w)=w^T x \quad (5)$$

where, ŷ is a predicted RUL, x is a 4δ+1 dimensional measurement array and w is a 4δ+1 dimensional weight array. The MLR algorithm fits w by minimizing the function in equation (6):

$$J(w) = \frac{1}{2m}\sum_{i=1}^{m}(w^T x_i - y_i)^2 + \lambda\sum_{j=1}^{n} w_j^2 \quad (6)$$

where, the first summand is traditional least squares term, and the second summand is a Ridge regularization term, introduced to avoid overfitting as in the case of the classification by the RUL classifier 702. The parameter in is number of training examples.

The processor 108 selects the features 318-326 from a set of features (e.g., 40 features) that are more relevant for the RUL estimation. For this, the selection may be performed based the sequential forward selection (SFS) and sequential backward selection (SBS) methods. The processor 108 may be configured to execute the SFS method or the SBS method. The SFS method starts with an empty set of measurements and evaluates each of them independently and selects the one feature that performs the best. The selected feature (e.g., the feature 318) is saved and added with each of the other features (e.g., the features 320-326). The SFS method keeps on selecting measurements, until all the features 318-326 are added. Further, the iteration with less error is selected as the best combination of features (e.g., the feature 314 of FIG. 3A). The SBS method selects the best combination of features by starting with a full dataset and evaluating error when each measurement is removed. The selected best combination of features 318-326 is provided as input to the neural network 106. One or more datasets that have less impact in the error are considered less important. Such datasets are eliminated.

In some embodiments, the neural network 106 corresponds to a Multi-Layer Perceptron (MLP) or Feed-Forward Neural Network (FFNN). The features 318-326 is submitted to the MLP neural network 106. The MLP neural network 106 includes a single hidden layer, as number of the features 318-326 is limited. Accordingly, the single hidden layer may have neurons, such as 32 neurons for the RUL estimation.

Each simulation of the MLR and MLP algorithms provide different results due to the random generation of the training, validation, and testing, which is described further with reference to FIG. 11.

FIG. 11 shows a table 1100 depicting error results based on simulation of Multivariable Linear Regression (MLP) and Multi-Layer Perceptron algorithms, according to some embodiments of the present disclosure. The error metrics provided are Root Mean Square Error (RMSE in cycles) and Mean Relative Error (MRE in %). In the table 1100, global MLR 1102 and global MLP 1104 algorithms are trained with a whole training dataset (maintaining 60% of the training dataset for training, 20% of the training dataset for cross-validation and 20% of the training dataset for testing). In case of MRE, near 50% the battery 114 with very low RUL (i.e., a few cycles) contributes a large impact on an averaged error. A small error of the few cycles for the battery 114 with less RUL (e.g., one of two cycles) leads to a large MRE. The MRE>150 cycles column in the table 1100 gives MRE conditioned on larger values of RUL cycles, with much better MRE metrics. In last rows of the table 1100, results 1106 for the multiple expert system 700 are shown. The results 1106 indicate performance of the global algorithm is enhanced, by obtaining an average MRE of 15.2% in the estimation of RUL for the battery 114 in any unknown moment of their life, and below 10% conditioned to long RUL of the battery 114.

Figure 12:
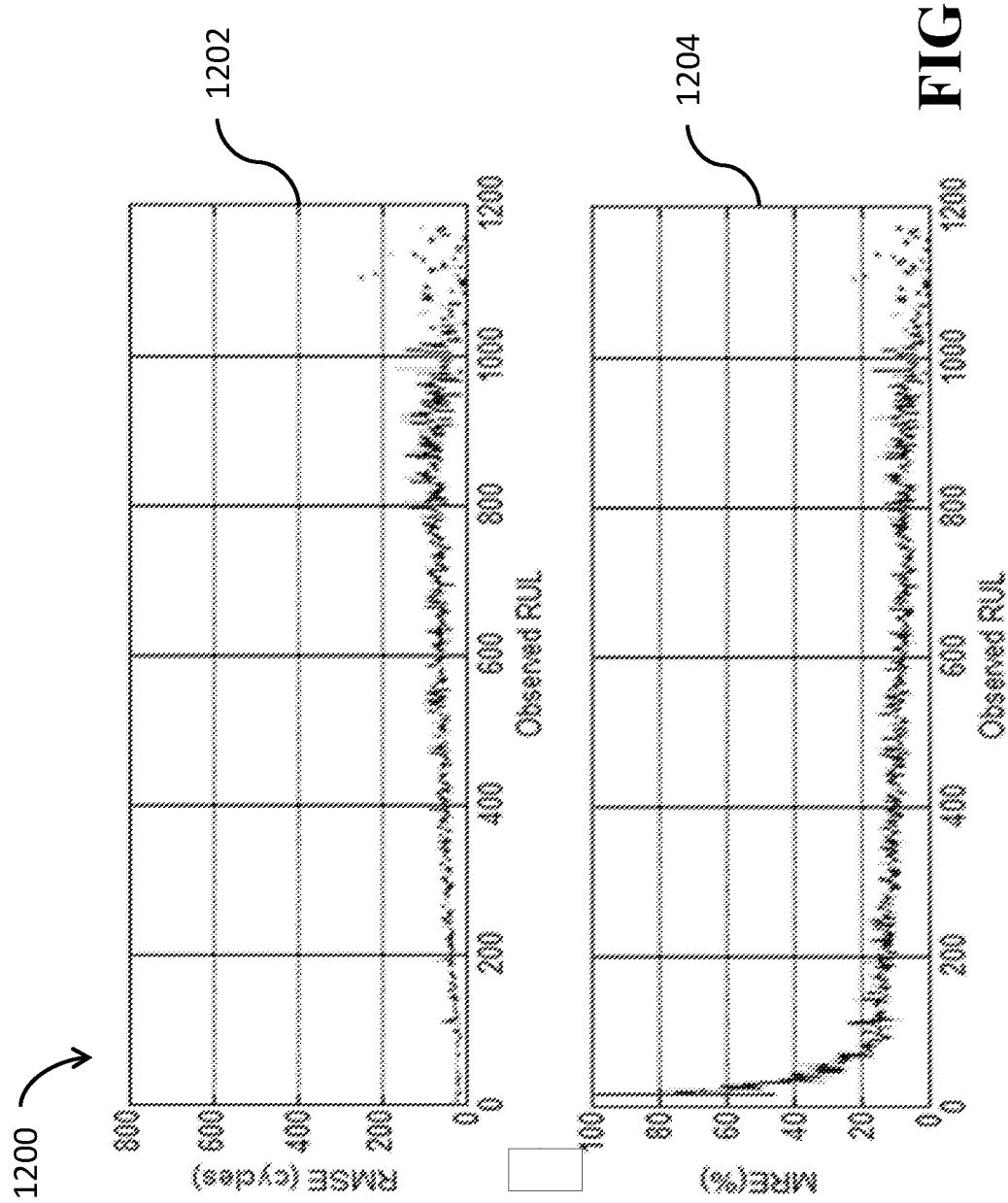
FIG. 12 shows a graphical representation depicting test results for the Multi-layer Perceptron for the RUL estimation using Root Mean Square Error (RMSE) metric and Mean Relative Error (MRE) metric, according to some embodiments of the present disclosure.

The RMSE and MRE metrics for each value of observed RUL cycles to be predicted for the battery 114 are described further with reference to FIG. 12.

FIG. 12 shows a graphical representation 1200 depicting test results for the Multi-layer Perceptron algorithm for the RUL estimation of the battery 114 using a Root Mean Square Error (RMSE) metric 1202 and a Mean Relative Error (MRE) metric 1204, according to some embodiments of the present disclosure. In some embodiments, the neural network 106 corresponds to the Multi-layer Perceptron algorithm and the neural network 106 includes a single hidden layer with neurons, such as 32 neurons for the RUL estimation, as number of the features 318-326 is limited. The RMSE metric 1202 and the MRE metric 1204 provide information on the RMSE and MRE obtained for each value of observed RUL cycles to be predicted. In MRE metric 1204 for the MLP algorithm, error is within 10-20% for practically the whole range of observed RUL.

Figure 13:
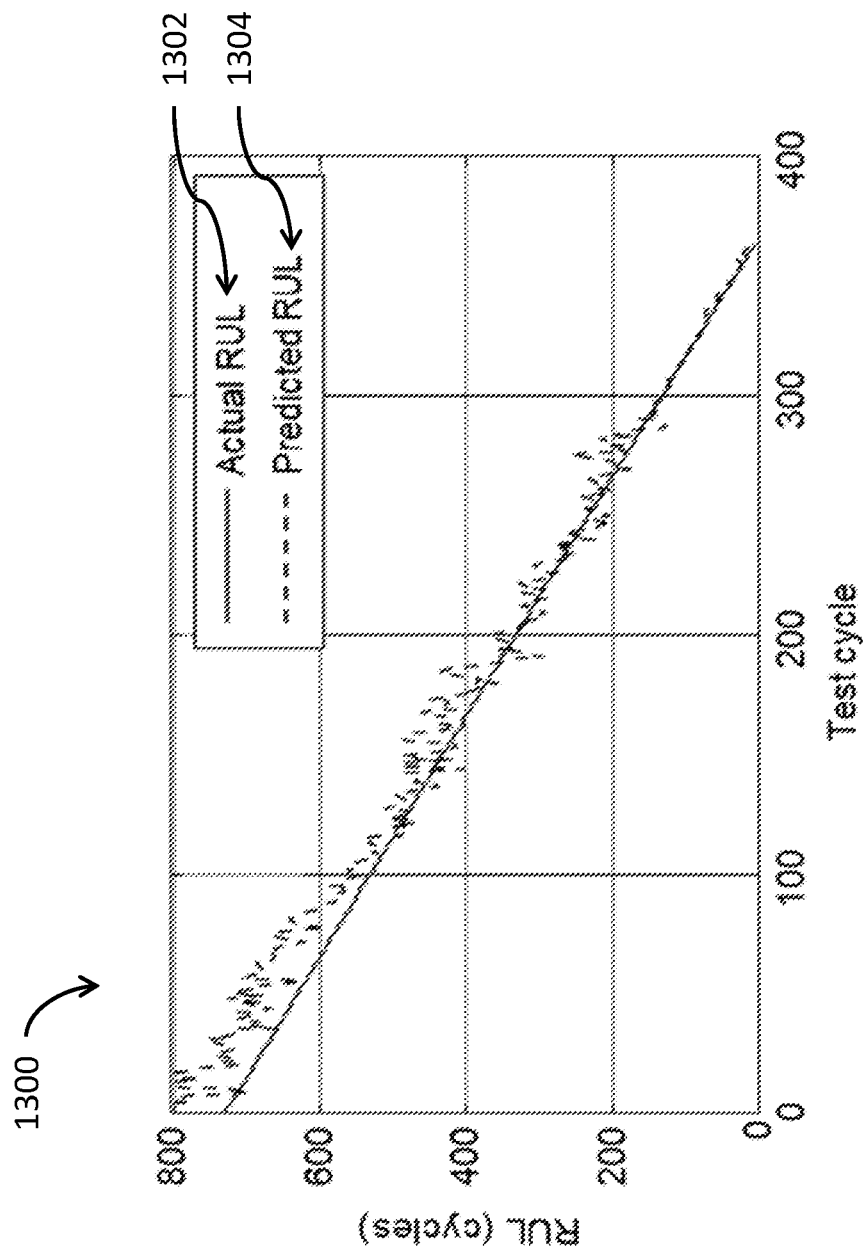
FIG. 13 shows a graphical representation depicting an exemplary RUL estimation for all test cycles for a specific battery in the dataset, according to some embodiments of the present disclosure.

FIG. 13 shows a graphical representation 1300 depicting an exemplary RUL estimation for all test cycles for the battery 114 using the training dataset, according to some embodiments of the present disclosure. For example, the training dataset may correspond to 100 number of datasets. As shown in FIG. 13, a predicted RUL curve 1304 falls accurately on an actual RUL line 1302. This is especially noticeable for low RUL values of the predicted curve 1304, where the short RUL expert 708 of the multiple expert system 700 comes into play (below 150 RUL cycles). Also, despite the higher MRE, the absolute prediction of the predicted RUL curve 1304 is much more accurate, as shown in FIG. 13.

Exemplar Embodiments

Figure 14:
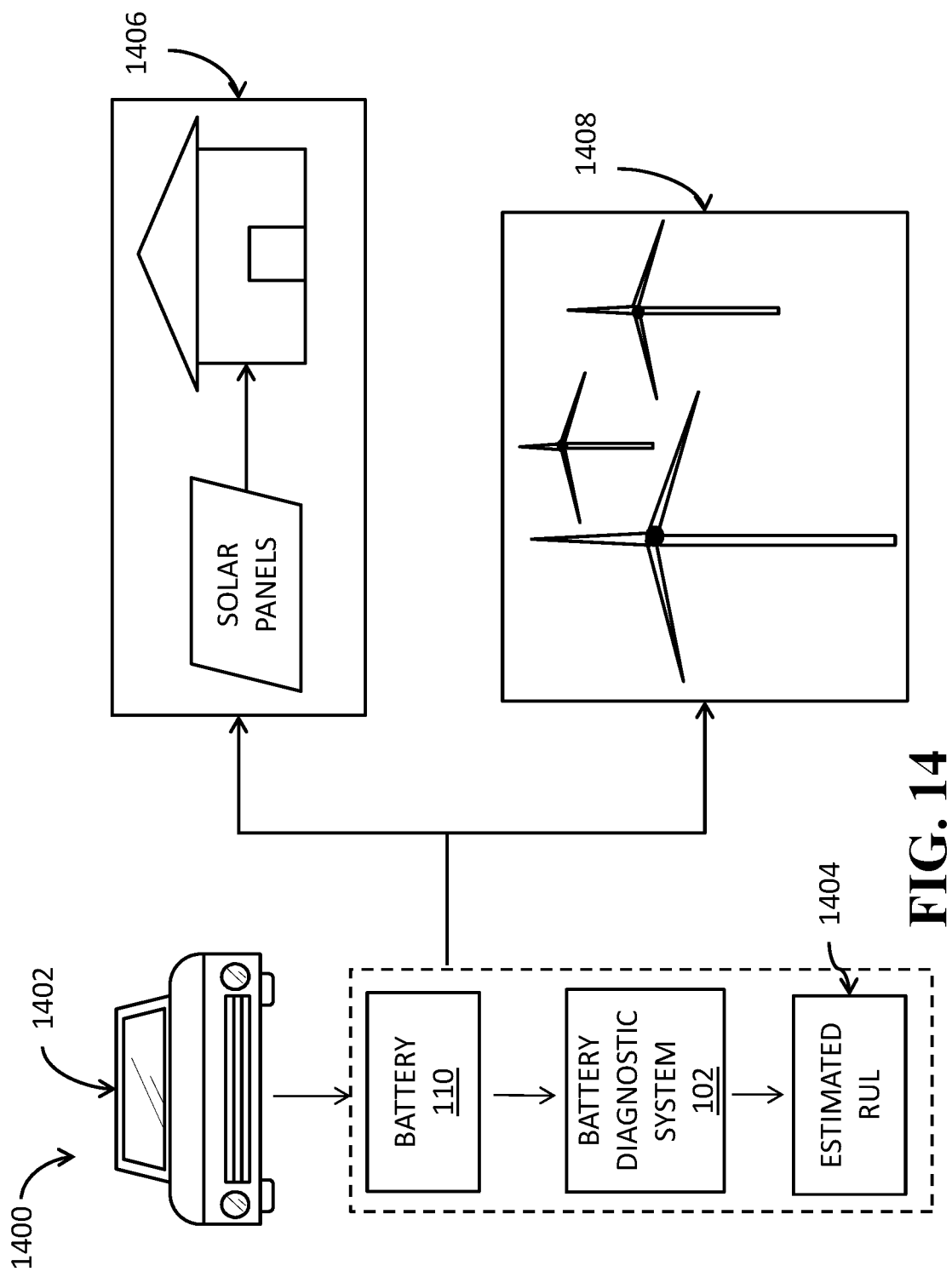
FIG. 14 illustrates exemplary scenario for repurposing the battery in second life applications, according to one example embodiment of the present disclosure.

FIG. 14 illustrates an exemplary scenario 1400 for repurposing the battery 114 in second life applications, according to one example embodiment of the present disclosure. The exemplary scenario 1400 is depicted to include an electric vehicle 1402 that may include a rechargeable battery (i.e., the battery 114) and the battery diagnostic system 102. The electric vehicle 1402 is powered by the rechargeable battery (i.e., the battery 114) battery 114. Once the service of the battery 114 for the electric vehicle 1402 is completed, the battery 114 is diagnosed by the battery diagnostic system 102. The battery diagnostic system 102 provides an estimated RUL 1404 as described in description of FIG. 1 and FIG. 7. The battery 114 is repurposed in second-life applications based on the estimated RUL 1404. The second-life applications may include application 1406 and application 1408. For instance, the application 1406 corresponds to solar based energy storage system and the application 1408 corresponds to renewable energy based energy storage system.

Figure 15:
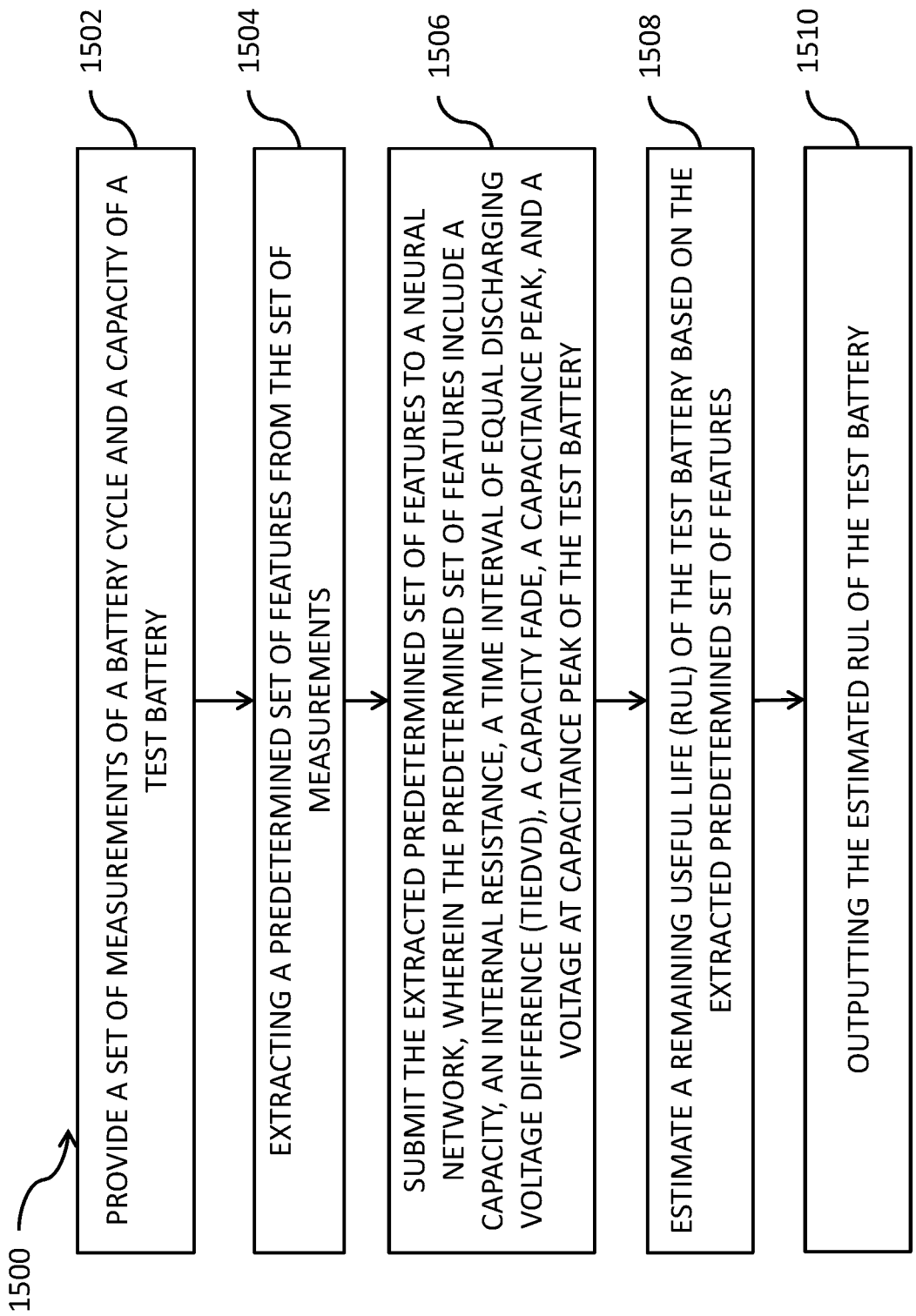
FIG. 15 shows a method flow diagram for estimating RUL of a test battery, according to some embodiments of the present disclosure.

FIG. 15 shows a method flow diagram 1500 for estimating RUL of a test battery (e.g., the battery 114), according to some embodiments of the present disclosure. At block 1502, a set of measurements of a battery cycle and a capacity of the test battery, is provided to the battery diagnostic system 102 (refer FIG. 2). The set of measurements are acquired by the charging system 110 (i.e., operation 206 of FIG. 2) through test cycles of the battery 114 using a training dataset. The test cycles comprises a sequence of charge-discharge cycles for the battery 114 (i.e., operation 204). In some embodiments, an optimal number for the battery cycle of the test battery is pre-determined based on a logistic regression algorithm (refer FIG. 8A).

At block 1504, a predetermined set of features is extracted from the set of measurements (i.e., operation 208). At block 1506, the extracted predetermined set of features is submitted to a neural network, such as the neural network 108 of FIG. 1. The neural network 108 comprises a Multivariable Linear Regression, a Feed-forward Neural Network or a Multi-layer Perceptron. The predetermined set of features include a capacity, an internal resistance, a time interval of equal discharging voltage difference (TIEDVD), a capacity fade, a capacitance peak and a voltage at capacitance of the test battery. The capacitance peak and the voltage at capacitance peak are derived based on voltage and discharge waveforms of the test battery generated in the battery cycle (as described in description of FIG. 5 and FIG. 6). In some embodiments, different stages of battery life of the test battery are indicated based on each of the extracted set of features (as described in description of FIG. 3B).

At block 1508, a remaining useful life (RUL) of the test battery estimated based on the extracted predetermined set of features. The estimation of the RUL comprises classifying the test battery into a short RUL or a long RUL (as described in description of FIG. 7). The short RUL class falls within a pre-determined classification threshold value and the long RUL exceeds the pre-determined classification threshold value. The classifier selects a corresponding expert system for each of the classified short RUL or long RUL (i.e., short RUL expert 708 or the long RUL expert 710) based on the classification. At block 1510, the estimated RUL of the test battery is outputted.

Figure 16:
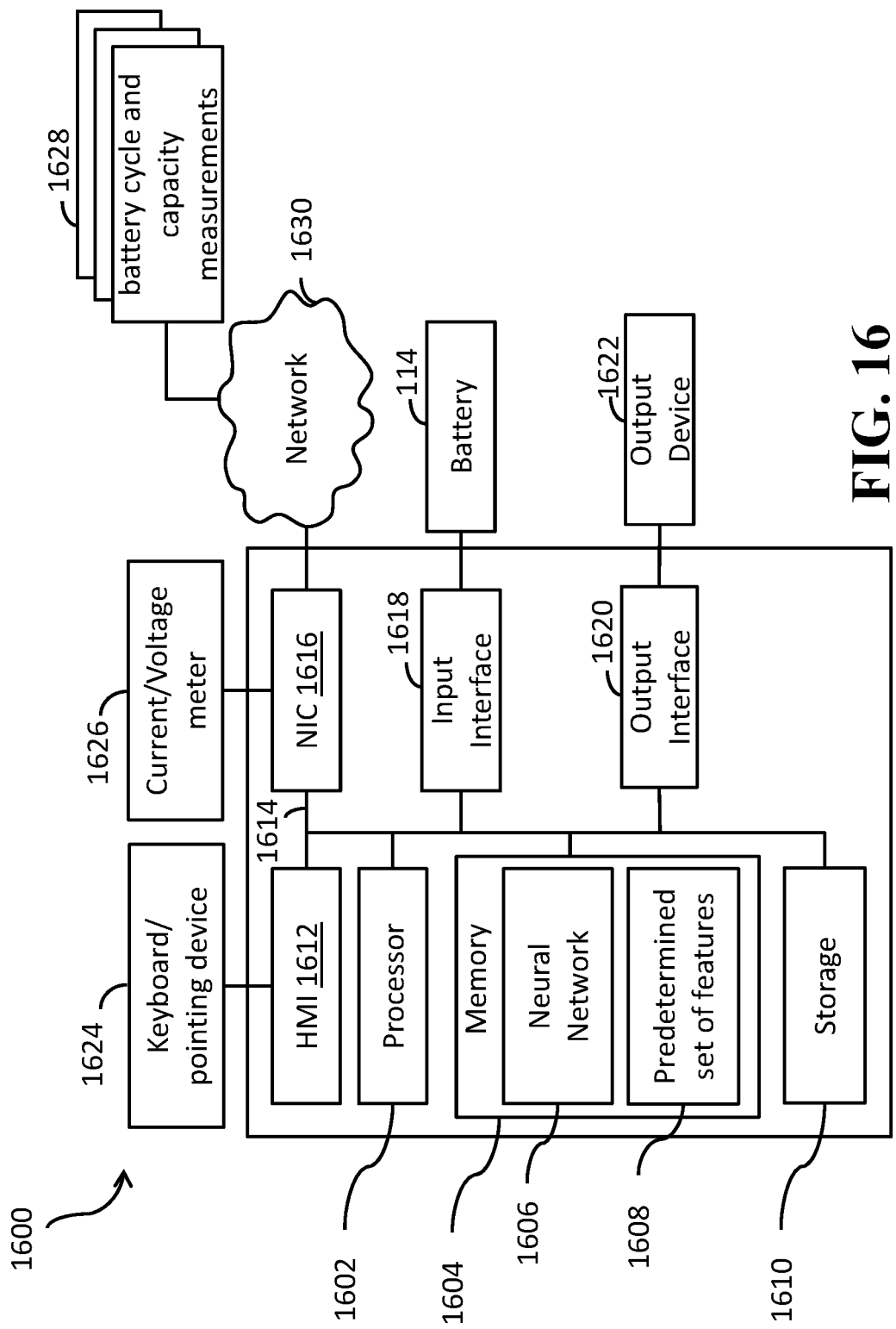
FIG. 16 shows a block diagram of a test battery diagnostic system for estimating RUL of a battery, according to some embodiments of the present disclosure.

FIG. 16 shows a block diagram of a test battery diagnostic system 1600 for estimating RUL of a battery, according to some embodiments of the present disclosure. The battery diagnostic system 1600 corresponds to the battery diagnostic system 102 of FIG. 1. The battery diagnostic system 1600 includes a processor 1602 configured to execute stored instructions, as well as a memory 1604 that stores instructions that are executable by the processor 1602. The processor 1602 corresponds to the processor 108 and the memory 1604 corresponds to the memory 104. The processor 1602 can be a single core processor, a multi-core processor, a computing cluster, or any number of other configurations. The memory 1604 can include random access memory (RAM), read only memory (ROM), flash memory, or any other suitable memory systems. The processor 1602 is connected through a bus 1612 to one or more input and output devices. These instructions implement a method 1500 for estimating RUL of a test battery, such as the battery 114.

In some implementations, the battery diagnostic system 1600 may have different types and combination of input interfaces to accept measurements indicative of a battery cycle and a current capacity of the test battery 114. In one implementation, a human machine interface 1612 within the battery diagnostic system 1600 connects the system 1600 to a keyboard and/or pointing device 1624, wherein the pointing device 1624 can include a mouse, trackball, touchpad, joy stick, pointing stick, stylus, or touchscreen, among others.

Additionally or alternatively, the battery diagnostic system 1600 can be connected to an input interface 1618 adapted to connect the system 1600 to the test battery 114. The test battery 114 is an electric or a rechargeable battery that can include one or more electrochemical cells with external connections provided to power electrical devices such as electric vehicles, flashlights, smart electronic devices. The input interface 1618 can be adapted to measure parameters of the test battery 114 such as voltage and current of the battery during its charging and/or discharging cycles. The test battery 114 may be charged and/or discharged by a charging system (not shown in FIG. 16), e.g. the charging system 110 of FIG. 1.

Additionally, or alternatively, a network interface controller (NIC) 1616 can be adapted to connect the battery diagnostic system 1600 through the bus 1612 to a network 1630. Through the network 1630, measurements 1628 indicative of a battery cycle and a capacity of the test battery 114 can be downloaded and stored within the memory 1604 for storage and/or further processing. Additionally, or alternatively, the NIC 1616 can be adapted to connect the battery diagnostic system 1600 to a current/voltage meter 1626 for measuring current and/or voltage of the test battery 114.

In addition to input interface 1618, the battery diagnostic system 1600 can include one or multiple output interfaces to output the estimated RUL of the test battery 114. For example, the battery diagnostic system 1600 can be linked through the bus 1614 to an output interface 1620 adapted to connect the battery diagnostic system 1600 to an output device 1622, wherein the output device 1622 can include a computer monitor, projector, a display device, a screen, mobile device, or the devices that may utilize a rechargeable battery (i.e., the battery 114).

The battery diagnostic system 1600 is configured to estimate the RUL using trained a neural network 1606 and a predetermined set of features 1608, where the neural network 1606 corresponds to the neural network 106. The neural network 1606 is trained to estimate the RUL of the test battery 114 from the predetermined set of features 1608 indicative of a battery cycle of the test battery 114 and a capacity of the test battery 114.

Each battery cycle is modeled from values of one or combination of voltages and currents measured for the batteries of the specific type at different capacities during one or combination of a charging cycle and a discharging cycle. Examples of measurements for forming a battery cycle include tail voltage measured during a discharge cycle, current measured during a discharge cycle, voltage during a charge cycle, current during a charge cycle, voltage during a charge and the following discharge cycle, voltage during a charge and the following discharge cycle, or in general, any of voltage/current during charge/discharge that is not pre-defined in advance and is allowed to vary and thus contain degradation information. For example, a storage device 1610 can be adapted to store the sets of trained models for the RUL estimation of the battery 114. The storage device 1610 can be implemented using a hard drive, an optical drive, a thumb drive, an array of drives, or any combinations thereof.

The invention claimed is:

1. A battery diagnostic system, comprising:
a memory configured to store a neural network trained to estimate a remaining useful life (RUL) of a test battery from a predetermined set of features indicative of a battery cycle of the test battery and a capacity of the test battery;
a charging system configured to charge and discharge the test battery to provide a set of measurements of the battery cycle and the capacity of the test battery;
a processor configured to extract the predetermined set of features from the set of measurements, wherein the extracted features include a capacity, an internal resistance, a time interval of an equal discharging voltage difference (TIEDVD), a capacity fade, a capacitance peak, and a voltage at capacitance peak of the test battery, wherein the TIEDVD is measured as a time interval corresponding to a discharging voltage difference between a minimum and a maximum voltage thresholds, wherein at least the minimum voltage threshold is selected to minimize a root mean squared error (RMSE) value for a linear regression of RUL based on the TIEDVD determined for different values of the minimum voltage threshold; and submit the extracted features to the neural network to estimate the RUL of the test battery; and
an output interface configured to output the estimated RUL of the test battery.

2. The battery diagnostic system of claim 1, wherein the capacity, the internal resistance, the TIEDVD, the capacity fade, the capacitance peak and the voltage at capacitance peak are determined based on a voltage waveform and a discharge waveform of the test battery, and wherein the voltage waveform and the discharge waveform are generated in the battery cycle.

3. The battery diagnostic system of claim 1, wherein different stages of battery life of the test battery are indicated based on evolution of the extracted features, such that any stage of battery life is indicated by at least one extracted feature.

4. The battery diagnostic system of claim 1, wherein the processor is further configured to:
   determine a probability value for the test battery based on a logistic regression algorithm; and
   classifying the test battery into a short RUL class or a long RUL class based on the probability value.

5. The battery diagnostic system of claim 4, wherein the short RUL class is associated with the probability value of the test battery less than a pre-determined classification threshold value, and wherein the long RUL class is associated with the probability value greater than the pre-determined classification threshold value.

6. The battery diagnostic system of claim 5, wherein the processor is further configured to select a corresponding expert system for each of the short RUL or long RUL based on the classification of the battery.

7. The battery diagnostic system of claim 1, wherein the neural network comprises one of a Multivariable Linear Regression, a Feed-forward Neural Network or a Multi-layer Perceptron.

8. A computer-implemented method for estimating a remaining useful life (RUL) of a test battery, wherein the method uses a processor coupled with stored instructions implementing the method, wherein the instructions, when executed by the processor carry out at steps of the method, comprising:
   providing a set of measurements of a battery cycle and a capacity of the test battery;
   extracting a predetermined set of features from the set of measurements, wherein the extracted set of features include a capacity, an internal resistance, a time interval of an equal discharging voltage difference (TIEDVD), a capacity fade, a capacitance peak, and a voltage at capacitance peak of the test battery, wherein different stages of battery life of the test battery are indicated based on an evolution of each of the extracted set of features;
   determining a probability value associated with the test battery based on a logistic regression algorithm;
   classifying the test battery into a short RUL class or a long RUL class based on the probability value, wherein the short RUL class is associated with the probability value of the test battery less than a pre-determined classification threshold value, and wherein the long RUL class is associated with the probability value greater than the pre-determined classification threshold value;
   submitting the extracted features to a neural network trained to estimate the RUL of the test battery from a predetermined set of features indicative of a battery cycle of the test battery and a capacity of the test battery; and
   outputting the estimated RUL of the test battery.

9. The method of claim 8, further comprising determining the capacity, the internal resistance, the TIEDVD, the capacity fade, the capacitance peak and the voltage at capacitance peak based on a voltage waveform and a discharge waveform of the test battery generated in the battery cycle.

10. The method of claim 8, wherein different stages of battery life of the test battery are indicated based on evolution of each of the extracted set of features.

11. The method of claim 10, further comprising combining differences in the evolution of each of the extracted set of features at the different stages of the battery life.

* * * * *